United States Patent
Koshiishi et al.

(10) Patent No.: US 7,882,800 B2
(45) Date of Patent: Feb. 8, 2011

(54) RING MECHANISM, AND PLASMA PROCESSING DEVICE USING THE RING MECHANISM

(75) Inventors: Akira Koshiishi, Yamanashi (JP); Mitsuru Hashimoto, Yamanashi (JP); Hideaki Tanaka, Yamanashi (JP); Shigeru Tahara, Yamanashi (JP); Kunihiko Hinata, Yamanashi (JP); Jun Ooyabu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 609 days.

(21) Appl. No.: 10/498,478

(22) PCT Filed: Dec. 12, 2002

(86) PCT No.: PCT/JP02/13016

§ 371 (c)(1),
(2), (4) Date: Jun. 14, 2004

(87) PCT Pub. No.: WO03/054947

PCT Pub. Date: Jul. 3, 2003

(65) Prior Publication Data

US 2005/0005859 A1     Jan. 13, 2005

(30) Foreign Application Priority Data

Dec. 13, 2001  (JP) ............................... 2001-379375
Feb. 5, 2002   (JP) ............................... 2002-027630
Mar. 5, 2002   (JP) ............................... 2002-058833

(51) Int. Cl.
*C23C 16/00*     (2006.01)

(52) U.S. Cl. .............................. 118/723 R; 156/345.45; 156/915

(58) Field of Classification Search ................. 156/915, 156/345.51, 345.45, 728; 118/723 R
See application file for complete search history.

(56) References Cited

U.S. PATENT DOCUMENTS 5,262,029 A * 11/1993 Erskine et al. ......... 204/298.15

(Continued)

FOREIGN PATENT DOCUMENTS

JP            07-245292         9/1995

(Continued)

*Primary Examiner*—Sylvia R. MacArthur
(74) *Attorney, Agent, or Firm*—Oblon, Spivak, McClelland, Maier & Neustadt, L.L.P.

(57) ABSTRACT

A ring mechanism, comprising a focus ring and divided cover rings surrounding a wafer W placed on a loading table (lower electrode) mounted in a processing chamber, wherein a ring-shaped clearance $\delta 1$ is provided between the divided rings to spread plasma to the radial outside of the focus ring to allow plasma to get therein, whereby a potential difference between the wafer W and the focus ring can be eliminated to prevent arc discharge by plasma from occurring between the wafer W and the focus ring.

32 Claims, 22 Drawing Sheets

U.S. PATENT DOCUMENTS

| | | | |
|---|---|---|---|
| 5,292,554 A * | 3/1994 | Sinha et al. | 427/251 |
| 5,529,657 A * | 6/1996 | Ishii | 156/345.26 |
| 5,556,500 A * | 9/1996 | Hasegawa et al. | 156/345.27 |
| 5,660,673 A * | 8/1997 | Miyoshi | 156/345.51 |
| 5,748,434 A * | 5/1998 | Rossman et al. | 361/234 |
| 6,042,687 A * | 3/2000 | Singh et al. | 156/345.33 |
| 6,159,299 A * | 12/2000 | Koai et al. | 118/715 |
| 6,210,593 B1 | 4/2001 | Ohkuni | |
| 6,344,105 B1 * | 2/2002 | Daugherty et al. | 156/345.51 |
| 6,676,803 B2 * | 1/2004 | Kim | 156/345.47 |
| 6,689,249 B2 * | 2/2004 | Ke et al. | 156/345.3 |
| 6,723,202 B2 * | 4/2004 | Nagaiwa et al. | 156/345.43 |
| 6,824,627 B2 * | 11/2004 | Dhindsa et al. | 156/60 |
| 2005/0005859 A1 * | 1/2005 | Koshiishi et al. | 118/728 |
| 2006/0011583 A1 * | 1/2006 | Bailey et al. | 216/67 |
| 2006/0144518 A1 * | 7/2006 | Kaji et al. | 156/345.43 |

FOREIGN PATENT DOCUMENTS

JP    2000-243707    9/2000

* cited by examiner

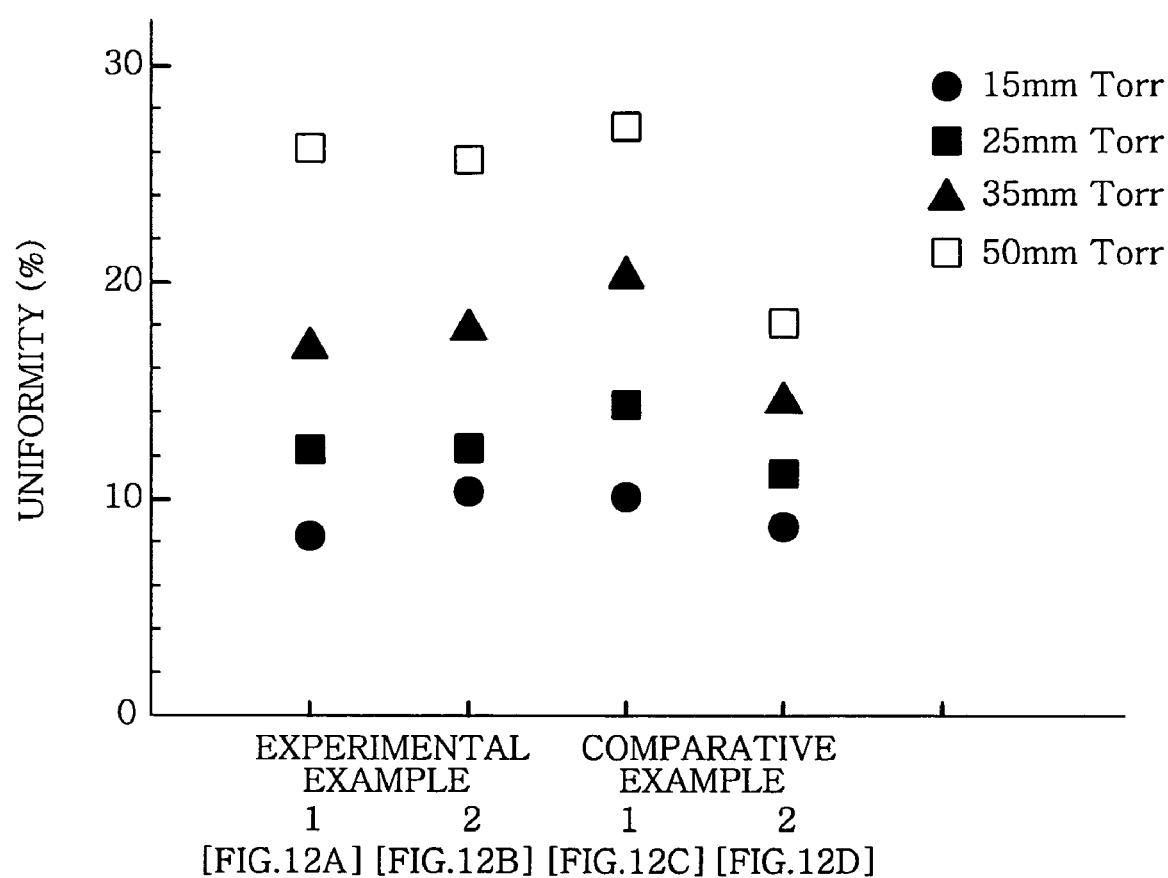

RING MECHANISM, AND PLASMA PROCESSING DEVICE USING THE RING MECHANISM

FIELD OF THE INVENTION

The present invention relates to a ring mechanism, which is disposed in the vicinity of an electrode of a plasma processing device and capable of converging plasma while realizing uniform distribution thereof, thereby preventing an abnormal discharge; and a plasma processing device using same.

BACKGROUND OF THE INVENTION

A plasma processing device for use in a manufacture of semiconductor includes a vacuum processing chamber capable of maintaining a vacuum state therein; a susceptor disposed within the chamber for mounting thereon an object to be processed, e.g., a semiconductor wafer (hereinafter simply referred to as a "wafer"); a gas supply unit for supplying a processing gas into the chamber; and a plasma generation unit for generating plasma in the chamber under the atmosphere of the processing gas of a predetermined vacuum level. The plasma generated by a high frequency power supplied from a high frequency power supply performs a plasma processing such as etching on the wafer placed on the susceptor.

The plasma generating unit includes an upper electrode (not shown) and a lower electrode disposed to face each other, wherein a susceptor 1 serves as the lower electrode and an electrostatic chuck is provided on a top surface of the susceptor, as shown in FIG. 4.

A focus ring 2 is disposed on a periphery of the susceptor 1 and serves to converge the plasma to the wafer w. There is a gap of about 1 mm between an outer periphery of the wafer W and an inner periphery of the focus ring 2.

Further, the focus ring 2 is surrounded by a cover ring 3 made of an insulating material. The cover ring 3 is supported on a base ring 4, which is fixed to the susceptor 1. Hereinafter, mainly a set containing a focus ring and a cover ring will be referred to as a ring mechanism.

Under such configuration, when processing the wafer W by generating the plasma, the plasma is concentrated at the wafer W by the focus ring 2 and an etching process or the like is performed on the wafer W. In such conventional ring mechanism, when the plasma is concentrated by the focus ring 2, the peripheral portion of the plasma reaches only a vicinity of the cover ring 3. As a result, the high frequency power (high frequency current) is mostly drawn into the wafer W and the focus ring 2, which in turn increases the electric potential difference therebetween. Since, however, the current does not always uniformly flow into the wafer W and the focus ring 2, there occurs a potential difference therebetween. As a result, an arc discharge occurs between the wafer W and the focus ring 2 as shown in FIG. 4, causing problems, e.g., damaging a circuit device formed on the wafer.

Such problem can be attributed to the gaps that exist between configuration parts disposed around the periphery of the susceptor. Further, according to the investigation undertaken by the applicants, it was proved that the structure of the cover ring has great influence on the occurrence of the arc discharge.

Further, a parallel plate type etching apparatus is well known among plasma processing devices for performing etching. As shown in FIG. 19, the etching apparatus includes a processing chamber 71 capable of maintaining a vacuum state therein, wherein the processing chamber 71 has therein a susceptor 72 also serving as a lower electrode. An upper electrode 76 is installed to face a loading surface of the susceptor 72 with a space defined as a processing space provided therebetween. The upper electrode 76 further serves as a gas supply unit for supplying a processing gas from a gas supply system (not shown) into the processing chamber. The processing chamber is evacuated via a gas exhaust line 73 by a vacuum pump system (not shown), thereby forming a vacuum state therein.

Provided on the outer periphery of the susceptor 72 are a focus ring (inner ring) 74 surrounding a loaded wafer W; and a cover ring (outer ring) 75 for fixing the focus ring 74. The focus ring 74 is made of a conductive or semiconductive material and the cover ring 75 is formed of an insulating material, e.g., quartz ($SiO_2$). The ring mechanism serves to converge plasma at the wafer W while increasing uniformity of etching rate. As shown in FIG. 20, the focus ring 74 is of a protruded shape, wherein an inner side of the top surface thereof forms a step 77 lowered by a thickness of the wafer W and an outer side of the top surface thereof forms a step 78 lowered by a thickness of a pressurizing click portion of the cover ring 75. By this configuration, the top surface of the wafer W, the top surfaces of the focus ring 74 and the cover ring 75 are set to be on a same horizontal plane.

Further, an outer end side of the cover ring 75 is tapered, thereby serving to provide uniform flow of exhaust gas or increase uniformity in the plasma. Further, in case the cover ring 75 is formed of quartz, oxygen radicals generated in etching the quartz act during parts of the etching process of the wafer W.

When using the focus ring 74 described above, the etching rate of a peripheral region (region in a vicinity of an outer end portion) of the wafer W is varied. In general, in case of processing a wafer W having a size of 8 inches, a focus ring 74 with a width of, e.g., about 30 mm, and a thickness of 6.5 mm is employed. In such a case, the etching rate tends to rapidly decrease at first and then sharply increase at the peripheral region of the wafer W, as shown in FIG. 21. The region showing such a great change is within about 10 mm from the peripheral portion of the wafer W.

Thus, when processing the wafer W on which a resist mask is formed, with the etching rate greatly increasing at the outer peripheral region of the wafer, an opening of the resist mask is enlarged compared with a central portion of the wafer. As a result, a line width of the outer peripheral region of the wafer becomes larger than that of the central region in a wiring formed by the etching, though the resist mask has originally the same line widths, so that uniformity in line widths over the entire surface of the wafer is deteriorated.

Furthermore, since the resist mask is coated with a uniform thickness by a spin coating method, the resist mask is removed faster at the outer peripheral region of the wafer than at a central region thereof, and thus thinned out. That is, since the resist mask on the outer peripheral region is removed during the processing, there is likelihood of an exposure of a surface covered by the mask.

Thus, by not being able to place a device at the peripheral side of the wafer W, a yield is lowered. Further, since pressure variation of the atmosphere of the plasma processing gas significantly influences the etching rate of the peripheral region of the wafer W, a tolerance of the pressure variation is reduced. Therefore, control of the etching rate by way of varying the pressure of the processing gas is difficult to achieve.

SUMMARY OF THE INVENTION

It is, therefore, an object of the present invention to provide a ring mechanism, which is installed at an electrode for a plasma, capable of realizing a plasma processing featuring a uniform processing rate by way of preventing an occurrence of an arc discharge between an object to be processed and a focus ring; and a plasma processing device using same.

In accordance the present invention, there is provided a ring mechanism including: a focus ring surrounding an object to be processed mounted on a susceptor disposed in a processing chamber capable of maintaining a vacuum therein; and a cover ring insertion fitted around an outer periphery of the focus ring with a clearance therebetween, wherein at a time of generating a plasma by applying a high frequency power, the plasma is made to get into the clearance of the outer periphery of the focus ring, thereby diffusing the plasma outwardly along diametric directions of the object to be processed.

Further, the present invention provides a plasma processing device including: a processing chamber capable of maintaining a vacuum therein; a gas exhaust system for creating a vacuum state by exhausting a gas in the processing chamber; a lower electrode mounted in the said processing chamber for mounting and maintaining an object to be processed; an upper electrode mounted in the processing chamber for introducing a processing gas; a high frequency power supply for applying high frequency powers of different frequencies to the lower electrode and the upper electrode; a focus ring for surrounding the object to be processed mounted on the lower electrode; and a cover ring insertion fitted around an outer periphery of the focus ring with a clearance therebetween, wherein at a time of generating plasma by applying the high frequency powers, the plasma is made to get into the clearance of the outer periphery of the focus ring, thereby diffusing the plasma outwardly along diametric directions of the object to be processed.

Further, the present invention provides a ring mechanism including: a focus ring surrounding an object to be processed mounted on a susceptor disposed in a processing chamber capable of maintaining a vacuum therein; and a cover ring insertion fitted at an outer periphery of the focus ring with a conductor disposed therebetween, wherein at a time of generating a plasma by applying a high frequency power, the plasma diffuses outwardly along diametric directions of the object to be processed via the conductor of the outer periphery of the focus ring.

Further, the present invention provides a plasma processing device including: a processing chamber capable of maintaining a vacuum therein; a gas exhaust system for creating a vacuum state by exhausting a gas in the processing chamber; a lower electrode mounted in the processing chamber for mounting and maintaining an object to be processed; an upper electrode mounted in the processing chamber for introducing a processing gas; a high frequency power supply for applying high frequency powers of different frequencies to the lower electrode and the upper electrode; a focus ring for surrounding the object to be processed mounted on the lower electrode; and a cover ring insertion fitted at an outer periphery of the focus ring with a conductor disposed therebetween, wherein at a time of generating a plasma by applying a high frequency power, the plasma diffuses outwardly along diametric directions of the object to be processed through the conductor of the outer periphery of the focus ring.

Further, the present invention provides a ring mechanism including: a first ring for surrounding an object to be processed mounted on a susceptor disposed in a processing chamber capable of maintaining a vacuum therein; and a second ring made of an insulating member and disposed around a periphery of the first ring, a top surface of the second ring being lower than a top surface of the first ring, wherein a chemical action caused by the second ring under a plasma environment is prevented from affecting the object to be processed by the top surface of the first ring.

BRIEF DESCRIPTION OF THE DRAWINGS

FIG. 13 describes uniformity in etching in the first verification example;

DETAILED DESCRIPTION OF THE PREFERRED EMBODIMENTS

Preferred embodiments of the present invention will now be described in detail.

Figure 1:
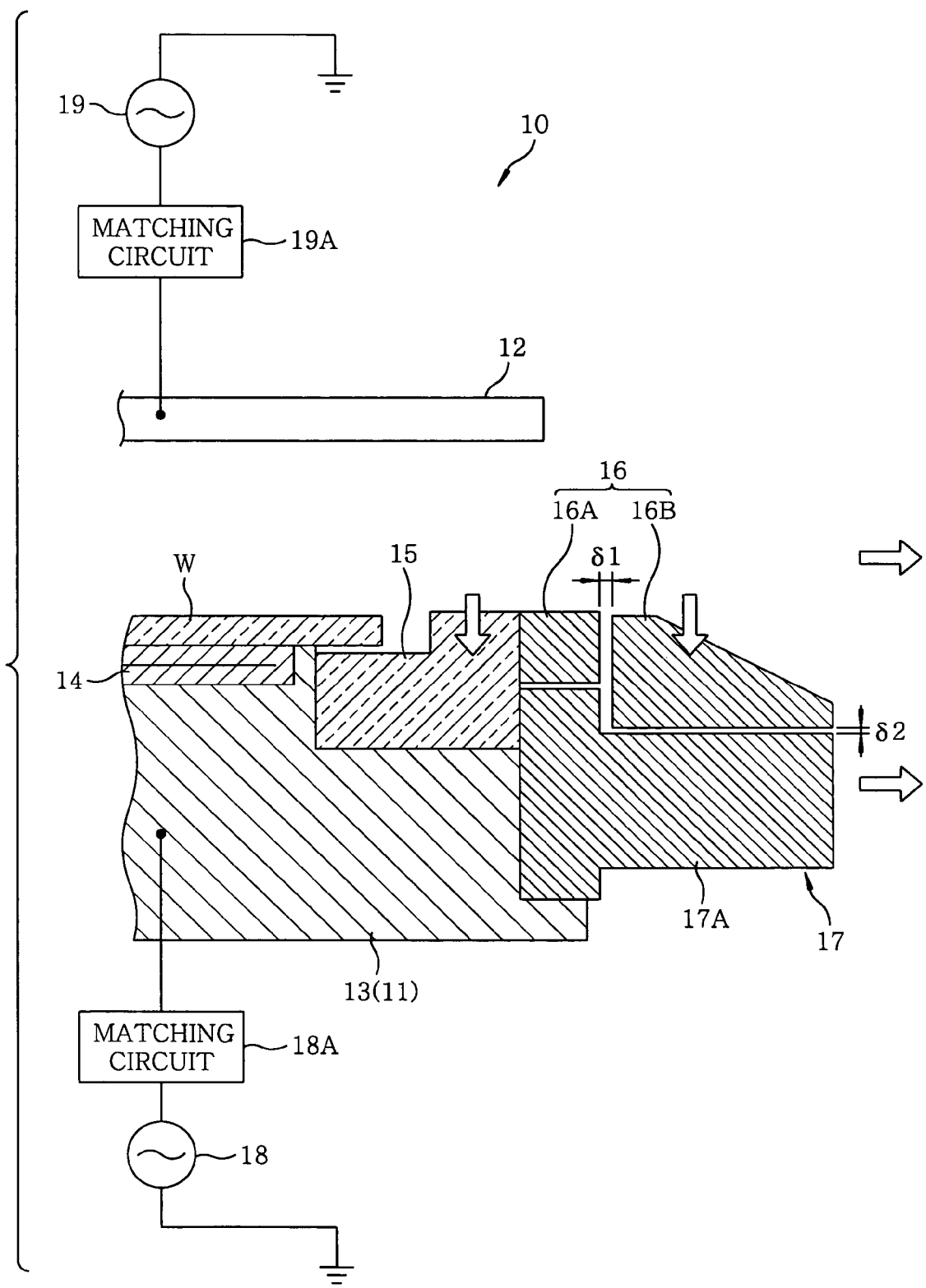
FIG. 1 is a schematic cross sectional view of a plasma processing device employing a ring mechanism in accordance with a first preferred embodiment of the present invention.

Referring to FIG. 1, there is provided a schematic cross sectional view of a plasma processing device employing a ring mechanism in accordance with a first preferred embodiment of the present invention. Further, in the preferred embodiment to be described hereinafter, a ring mechanism refers to a configuration mainly including a focus ring (inner ring) and a cover ring (outer ring).

In a plasma processing device 10, there are disposed a susceptor 11 for mounting thereon an object to be processed, e.g., a wafer W, while serving as a lower electrode and an upper electrode 12 installed above the susceptor 11 with a predetermined interval maintained therebetween in a vacuum processing chamber (not shown). Provided on a top surface (loading surface) of the lower electrode 13 is an electrostatic chuck 14.

Further, a two step annular portion is formed at an outer peripheral portion of the lower electrode 13 along the outer circumference thereof. In the two-step annular portion, a focus ring 15 is insertion fitted at an upper portion thereof and a base ring 17 is insertion fitted at a lower step portion thereof. The focus ring 15 is formed of, e.g., silicon or ceramic. That is, an inner side of the top surface of the lower electrode 13 serves as the loading surface of the wafer W and the focus ring 15 is disposed on an outer peripheral side thereof. Further, a gap is provided between the wafer W and the focus ring 15 in a vertical direction in order to prevent a direct contact therebetween.

In the lower electrode 13, formed on the loading surface of the wafer W and a loading surface of the focus ring 15 are thermally sprayed coatings (not shown) made of a dielectric, e.g., ceramic such as oxide titanium or a heat resistant resin such as a polyimide-based resin.

Furthermore, the electrostatic chuck 14 electrostatically attracts and holds the wafer W when a high voltage from a high voltage DC power supply (not shown) is applied to an electrode plate embedded therein. The focus ring 15 is surrounded by a divided cover ring 16 disposed at the radial outside thereof. The cover ring 16 is supported by a base ring 17. The cover ring 16 and the base ring 17 are formed of quartz.

In addition, connected to the lower electrode 13 is a first high frequency power supply 18 via a matching circuit 18A for achieving an impedance matching of a high frequency power. Further, connected to the upper electrode 12 is a second high frequency power supply 19 via a matching unit 19A for achieving an impedance matching of a high frequency power. The first high frequency power supply 18 outputs a high frequency power having a lower frequency than that of the high frequency power outputted from the second high frequency power supply 19. Though the case of supplying high frequency powers of different frequencies to both of the lower electrode 13 and the upper electrode 12 is described in the first preferred embodiment, the present invention is not limited thereto and can also be employed in a processing apparatus for generating plasma by applying a high frequency power to one of the lower electrode 13 and the upper electrode 12. Further, the plasma can also be generated by using a device other than the high frequency power supply. Such modification may take place in second to fourth preferred embodiments to be described later.

The second high frequency power supply 19 is used as a power supply for a generation of plasma while the first high frequency power supply 18 is used as a power supply for an application of a bias potential.

Further, the upper electrode 12 which includes a shower head (not shown) for distributing and supplying, e.g., a processing gas, into the processing chamber with a uniform concentration is used in supplying of the process gas.

The divided cover ring 16 includes a first component 16A having an annular shape and a cross section of, e.g., a rectangular shape; and a second component 16B having an annular shape with a tapered outer side for surrounding the first component 16A. The base ring 17 is of, for example, in a bucket shape, having a flange 17A formed at about halfway between the top and the bottom thereof.

The first component 16A of the cover ring 16 is disposed on the base ring 17 with a gap therebetween and the second component 16B is mounted on the flange 17A of the base ring 17. A predetermined gap $\delta 1$ between the first and the second components 16A and 16B is provided, which serves to diffuse the plasma radially outward, as will be described later. Further, a gap $\delta 2$ between the first and second components 16A, 16B and the base ring 17 is also provided. The gap $\delta 2$ is based on a manufacturing tolerance of the cover ring 16 and the base ring 17.

In performing the plasma processing on the wafer W, the wafer W is electrostatically attracted and held to the electrostatic chuck 14 in the chamber and, at the same time, the processing gas is supplied into the processing chamber, thereby generating the processing gas atmosphere. Concurrently, the high frequency powers are applied to the lower electrode 13 and the upper electrode 12 from the high frequency power supplies 18 and 19, respectively, thereby generating the plasma between the two electrodes. The plasma is collected on the wafer W due to the operation of the focus ring 15, so that the plasma processing such as etching is carried out on the wafer W.

During the plasma processing, the plasma of high density is uniformly formed on the wafer W and some of the plasma is also applied to the outside of the focus ring. Further, high frequency currents from the high frequency power supply 19 flow into the wafer W, the focus ring 15, the cover ring 16 and an inner wall surface of the chamber through the plasma as indicated by arrows in FIG. 1.

Though the high frequency current identical to that of the conventional case flows into the wafer W at this time, the high frequency currents flow into the focus ring 15, the cover ring 16 and the inner wall surface in a manner different from that in the conventional case. That is, the cover ring 16 is divided into the first component 16A and the second component 16B, and the gap $\delta 1$ having a size equal to or greater than a design tolerance is provided therebetween. The plasma smoothly gets into the gap δ1, so that the plasma at the exterior of the focus ring 15 is diffused raidally outward.

Figure 2:
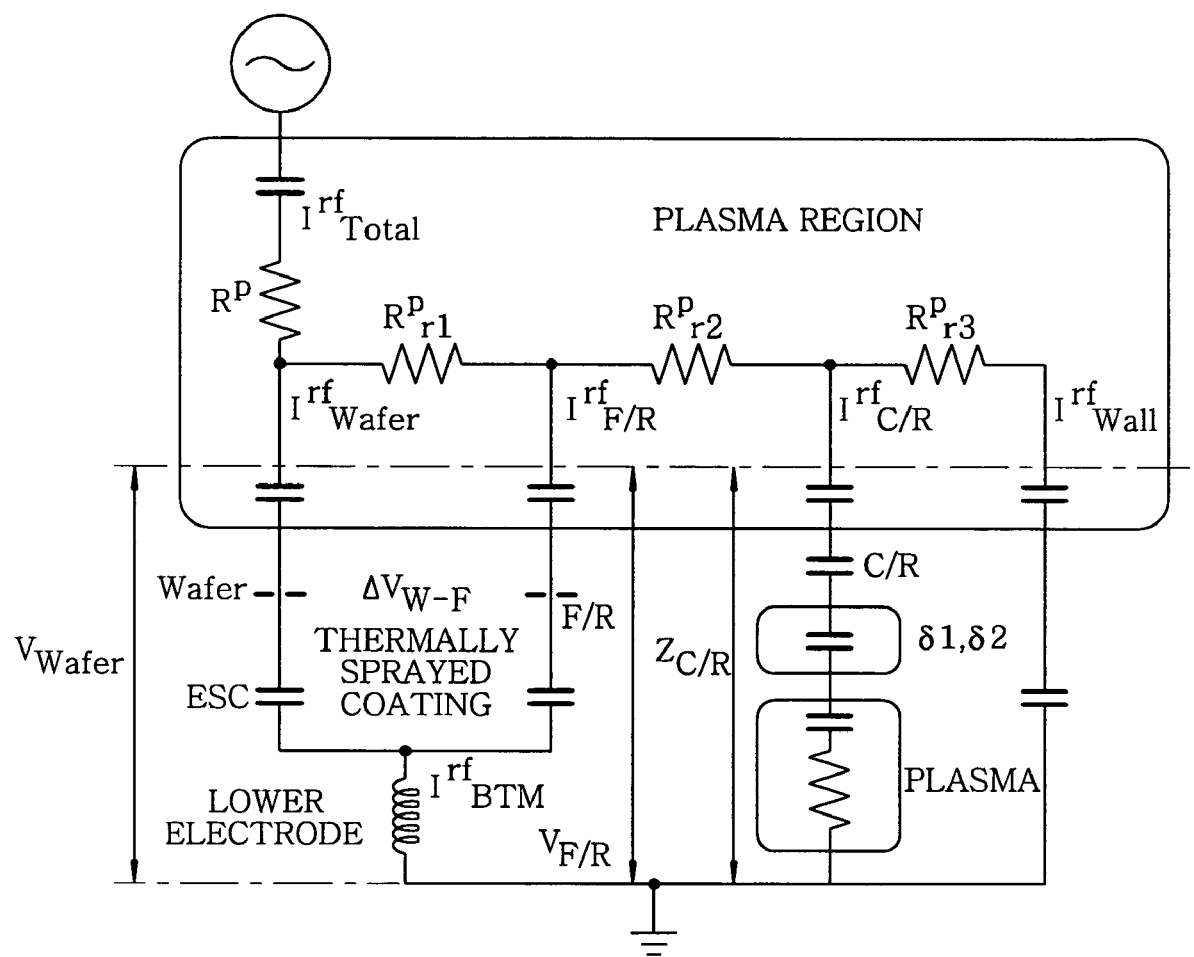
FIG. 2 describes an equivalent circuit of the plasma processing device shown in FIG. 1.

Further, by forming a tapered surface at upper edge portion of facing surface of the first component 16A and the second component 16B, the plasma can be made to get into the gap δ1 more easily. The plasma in the gap δ1 serves as a conductive medium while forming a current passageway of the high frequency currents, thereby facilitating the flow of the high frequency currents within the gap δ1. As a result, a current value flowing into the cover ring 16 from the plasma is increased while a current value flowing into the lower electrode 13 is decreased. FIG. 2 describes such a state as an equivalent circuit.

As shown in FIG. 2, an internal resistance $R^P$ of a plasma region P is divided into resistance components $R^P_{r1}$, $R^P_{r2}$ and $R^P_{r3}$ of the high frequency currents $I^{rf}_{F/R}$, $I^{rf}_{C/R}$ and $I^{rf}_{Wall}$ flowing through the focus ring 15, the cover ring 16 and the inner wall surface of the processing chamber, respectively. Formed between the plasma region P and the wafer W, the focus ring 15, the cover ring 16 and the upper electrode 12 are sheath capacitances. Each sheath capacitance is electrically connected to capacitances of the electrostatic chuck 14, a thermally sprayed coating and the cover ring 16.

Furthermore, each capacitance of the electrostatic chuck 14 and the thermally sprayed coating is respectively coupled to a ground potential via an inductance of the lower electrode 13. The sheath capacitance of the inner wall surface is directly connected to the ground potential. Accordingly, the high frequency current branches into the currents through the wafer W, the focus ring 15, the cover ring 16 and the inner wall surface, and are finally converged into the ground potential.

Moreover, since there exist the gap δ1 between the first and the second component 16A and 16B of the cover ring 16 and the gap δ2 between the cover ring 16 and the base ring, the gap δ1 and δ2 function as capacitance components shown in FIG. 2. Such capacitance components are expressed in FIG. 2 as the gaps δ1 and δ2 surrounded by a square. Furthermore, since plasma exists in the gap δ1, a sheath capacitance is formed between the plasma and the first component 16A, the second component 16B and the base ring 17. Further, the plasma hardly gets into the gap δ2.

Further, the plasma itself has an internal resistance as mentioned above. In FIG. 2, the sheath capacitance and the internal resistance in the gap δ1 are shown as the plasma region surrounded by a square. As a result, an impedance $Z_{C/R}$ at a time when the high frequency current $I^{rf}_{C/R}$ flows through the ground potential via the cover ring 16 is reduced due to the capacitance components of the gaps 61 and 62, and the internal resistance and the sheath capacitance of the plasma in the gap 61. The value of the current $I^{rf}_{C/R}$ flowing through the cover ring 16 is increased due to the reduction in the impedence $Z_{C/R}$.

Since the current value $I^{rf}_{C/R}$ of the cover ring 16 is increased, the current $I^{rf}_{BTM}$ flowing through the lower electrode 13 is relatively lowered and a potential $V_{wafer}$ of the wafer W and a potential $V_{F/R}$ of the focus ring 15 are reduced, and a potential deference $\Delta V_{W-F}$ therebetween is reduced. Accordingly, an electric field strength between a peripheral surface of the wafer W and the opposing surface of the focus ring 15 is reduced, thereby preventing a generation of an arc discharge therebetween.

Next, in order to investigate effects of the gap δ1 provided between the first and the second component 16A and 16B of the cover ring 16, electric field simulations for obtaining electric field strengths between the peripheral surface of the wafer W and the opposing surface of the focus ring 15 were conducted by using the divided cover ring in accordance with the first preferred embodiment and a conventional single-unit cover ring, respectively, under a constant process condition. At this time, the gap δ1 between the first and the second component 16A and 16B of the divided cover ring 16 was set to be 1 mm. A resistivity value within the gap δ1 was used as a parameter. The electric field strengths were obtained in case of varying a resistivity value of a conductor disposed within the gap δ1 at 1 Ωm, 10 Ωm and 1000 Ωm. For example, Si, SiC, Al or the like, were considered as the conductor. Further, as for other parameters, a resistivity value of the plasma, a resistivity value of the lower electrode and the impedance of the plasma region P were assumed to be 1.5 Ωm and 50 Ωm and range from 5 to 10 Ω, respectively.

Figure 3:
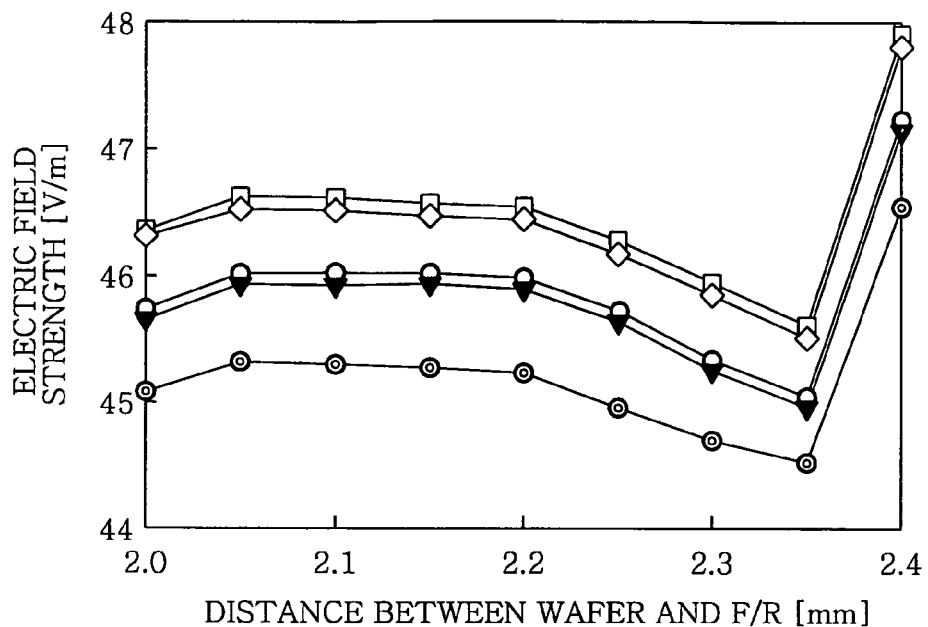
FIG. 3 provides a simulation result of electric field strengths between a wafer and a focus ring in the ring mechanism shown in FIG. 1.
Figure 4:
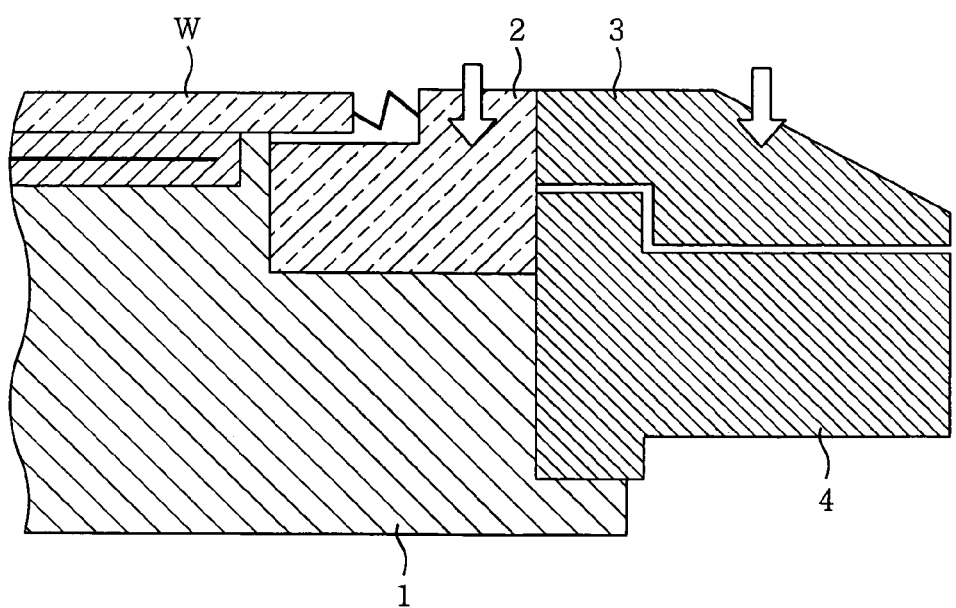
FIG. 4 depicts a schematic cross sectional view of a plasma processing device employing a conventional ring mechanism.

Under the above-specified conditions, electric field strengths between the wafer W and the focus ring 15 were obtained, and the result is provided in FIG. 3. In FIG. 3, □ represents a case of not inserting a conductor in the gap δ1 of the divided cover ring; ⊙ represents a case of inserting the conductor of 1 Ωm in the gap δ1; ▼ represents a case of inserting the conductor of 10 Ωm in the gap δ1; ◊ represents a case of inserting the conductor of 1000 Ωm in the gap δ1; and ○ represents a case of employing the conventional single-unit cover ring.

Referring to the result of the electric field simulations shown in FIG. 3, it was shown that even though the divided cover ring was employed, its electric field strength was higher than that of the conventional single-unit cover ring unless a conductor was disposed in the gap δ1. Though the conductor having the high resistivity of 1000 Ωm was disposed in the gap δ1, substantially the same result as obtained in the case of not employing the conductor was attained. However, as the resistivity value of the conductor inserted into the gap δ1 was lowered, the electric field strength became reduced as well, so that the same electric field strength as obtained in the case of using the single-unit cover ring was finally attained when the resistivity value of the conductor was 10 Ωm. If the resistivity value of the conductor was further reduced down to 1 Ωm, the electric field strength was proved to be significantly reduced in comparison with the case of using the single-unit cover ring. In other words, it is shown that if the resistivity value of the conductor is set to be equal to or less than 10 Ωm, the electric field strength is lower than that of the single-unit cover ring, thereby preventing an arc discharge between the wafer W and the focus ring 15. For example, it was observed that plasma is capable of getting the gap and serving as the conductor, thereby preventing the arc discharge when the resistivity value thereof is about 1.5 Ωm.

In accordance with the first embodiment described above, since the divided cover ring 16 is installed at the outside of the focus ring 15 as a means for diffusing the plasma of the radial outside of the focus ring 15 toward the radial outside thereof and, at the same time, the gap δ1 was provided between the first and the second component 16A and 16B of the divided cover ring 16, the plasma gets into the gap δ1 so that the plasma serves as a conductive medium.

That is, while the gap δ1 functions as the current passageway of the high frequency current generated from the high frequency power supply 19 so that it passes the high frequency current therethrough, it reduces a difference in the high frequency currents flowing through the wafer W and the focus ring 15, thereby lowering a potential difference between the wafer W and the focus ring. Resultantly, an arc discharge can be prevented from occurring therebetween.

Further, though the first preferred embodiment has been described for the case of using the divided cover ring 16 as an external part of the focus ring 15, it is also possible to employ a part other than the cover ring only if the part is of a divided type.

Furthermore, though the first preferred embodiment has been explained for the case of using the divided cover ring 16, it is also possible to use a single-unit cover ring and prepare a gap therearound partially or entirely. Further, though the plasma getting the gap δ1 of the divided cover ring 16 is utilized as the conductive medium in the first preferred embodiment, it is also possible to interpose a conductive medium (conductor) other than the plasma in the gap δ1. Further, the to-be-processed object is not limited to the wafer W, either.

Figure 5:
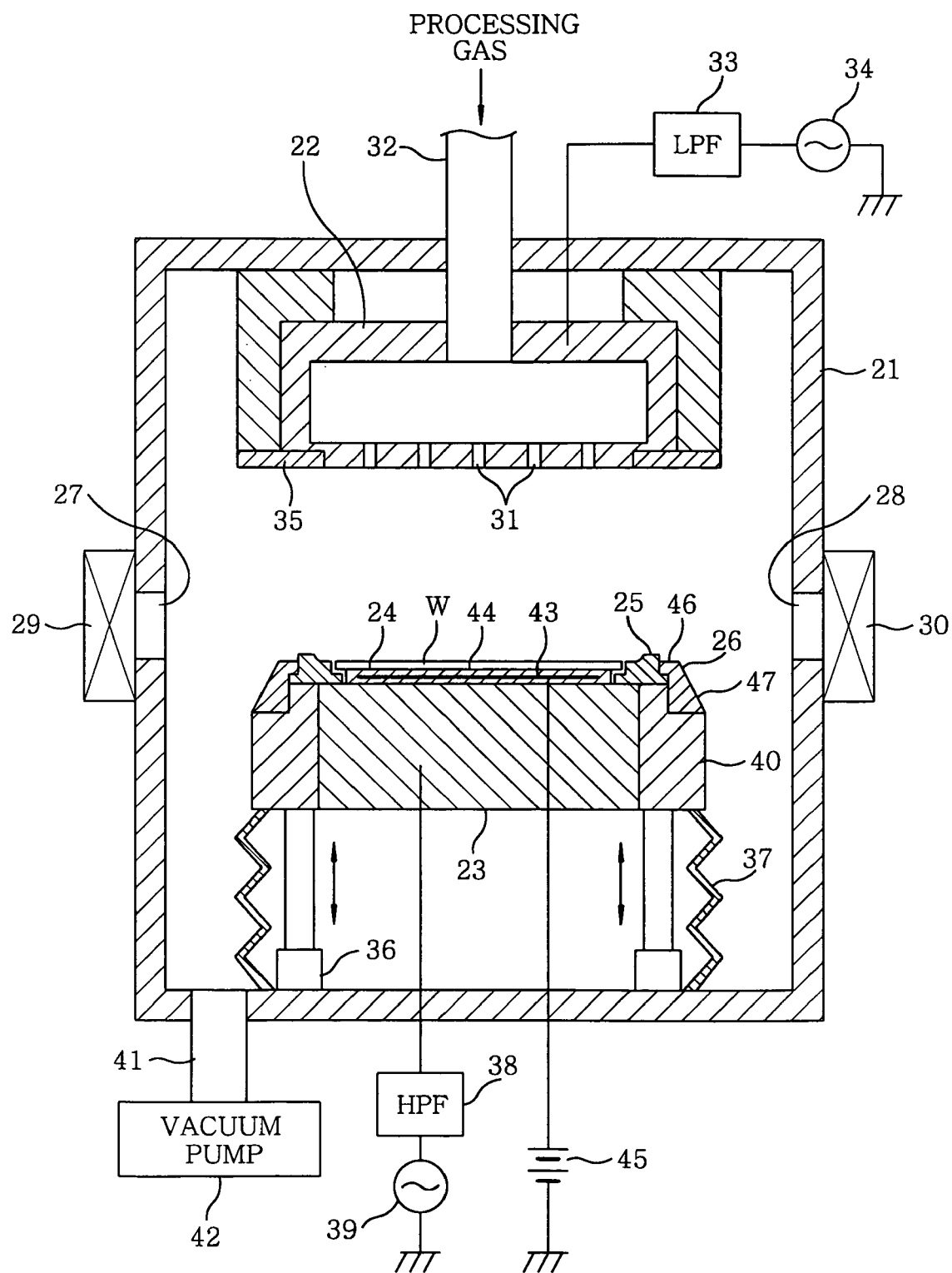
FIG. 5 illustrates a schematic cross sectional view of a plasma processing device employing a ring mechanism in accordance with a second preferred embodiment of the present invention.
Figure 6:
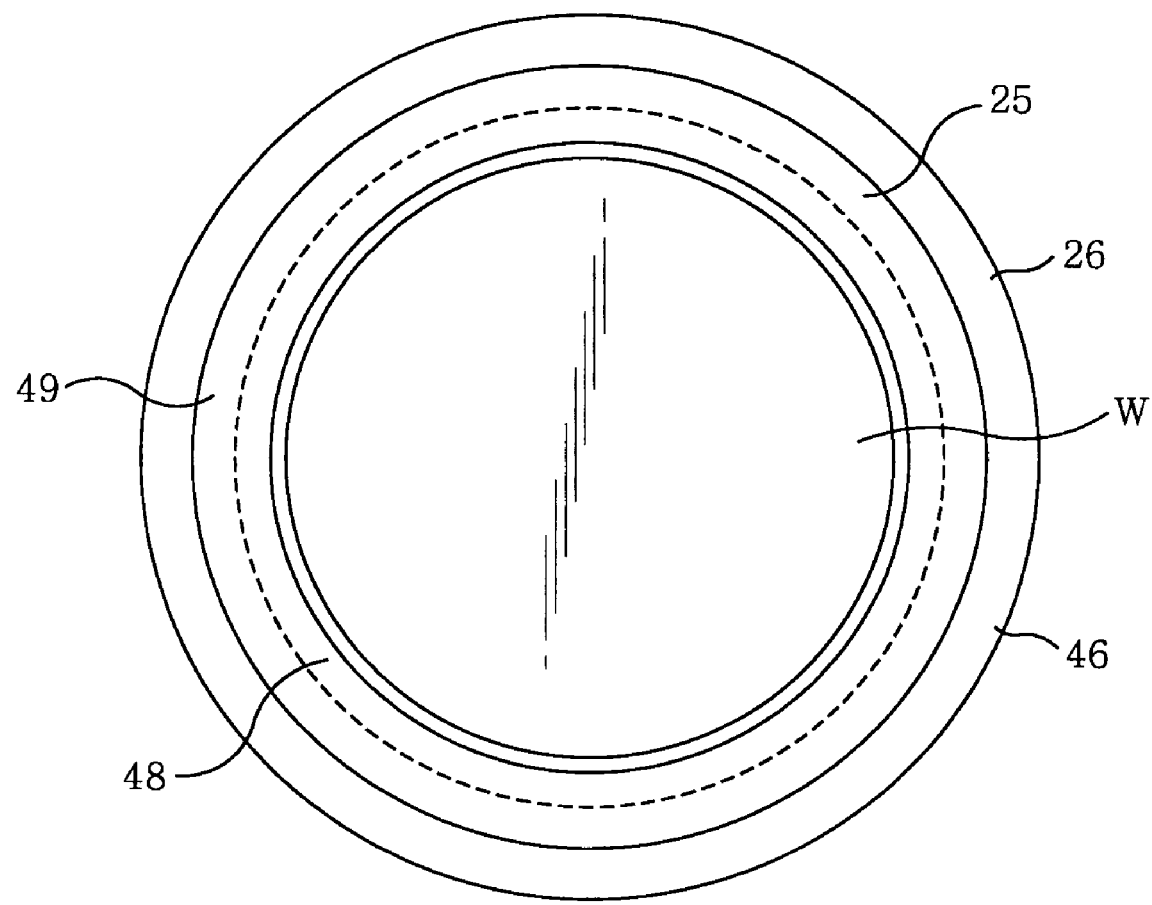
FIG. 6 is a plan view of the ring mechanism in accordance with the second preferred embodiment.

Referring to FIG. 5, there is provided a schematic cross sectional view of a plasma processing device employing a ring mechanism in accordance with a second preferred embodiment of the present invention. FIG. 6 is a plan view illustrating a structure of the ring mechanism in the second preferred embodiment.

The plasma processing device includes a cylindrical processing chamber 21 made of, e.g., aluminum, incorporating therein an upper electrode 22 and a lower electrode 23 disposed to face each other in the processing chamber 21.

Formed on a sidewall of the processing chamber 21 are openings 27 and 28 through which a wafer W is loaded into or unloaded from the processing chamber 21. The openings 27 and 28 are opened and closed from the outside by gate valves 29 and 30, respectively, so that the inside of the processing chamber 21 can be maintained in a vacuum state. The lower electrode 23 also serves as a susceptor of the wafer W and is disposed on an elevation mechanism 36 installed at a lower portion of the processing chamber 21, in a manner that it can be moved vertically. The elevation mechanism 36 includes, for example, a hydraulic cylinder or a screw coupling mechanism with ball screws and nuts and a combination mechanism such as a servo motor for rotating the coupling mechanism. Provided between vicinity of the elevation mechanism 36 and the inner wall of the bottom wall of the processing chamber 21 is a bellows member 37, which prevents the plasma generated within the processing chamber 21 from getting into the space below the lower electrode 23.

The lower electrode 23 is connected via a high pass filter 38 to a high frequency power supply unit 39 for supplying a voltage having a frequency of, e.g., 2 MHz and a ground. The high pass filter 38 functions to suppress an invasion of a high frequency component applied to the upper electrode 22.

Formed on a top surface of the lower electrode 23 is an electrostatic chuck 24 for fixing the wafer W. The electrostatic chuck 24 is formed of a conductive electrode plate 43 of a sheet shape and a polyimide layer 44 for covering the entire surface of the electrode plate 43. The electrode plate 43 is electrically connected to a DC power supply unit 45 for generating a Coulombic force for maintaining the wafer W. Further, when the high frequency power is applied, the maintenance force of the wafer W is enhanced.

Further, an annular base plate 40 made of, e.g., quartz is installed around the lower electrode 23 in a manner that its top surface is even with the top surface of the lower electrode 23. A focus ring (inner ring) 25, which is made of a conductor, e.g., silicon (Si), and serves as a first ring, is disposed around the wafer W on the top surface of the lower electrode 23 so as to extend over the lower electrode 23 and the base plate 40.

The inner ring 25 diffuses dense plasma of the end portion of the wafer, thereby enhancing the uniformity thereof. The inner ring 25 exhibits a high electrical conductibility and it is preferably that the inner ring 25 is formed of, e.g., silicon of 2Ω. However, it is not limited to the conductive material but it can also be made of a semi-conductive material. An annular cover ring (outer ring) 26, which is formed of an insulator, e.g., quartz ($SiO_2$), and serves as a second ring, is installed on a top surface of the base plate 40 around the inner ring 25. The inner ring 25 and the outer ring 26 are respectively disposed to be concentric with the wafer W mounted on the lower electrode 23 as shown in FIG. 6, for example.

The outer ring 26 has a function of a cover ring for pressing the inner ring 25 toward the lower electrode 23 and the base plate 40; a function of improving the uniformity of the plasma from the end portion of the wafer W to the space above the inner ring 25; a function of rectifying a gas flow within the processing chamber 21; and, in case the outer ring 26 is formed of quartz, it also has a function of promoting the etching of the wafer due to oxygen radicals generated from the quartz being etched.

Figure 7:
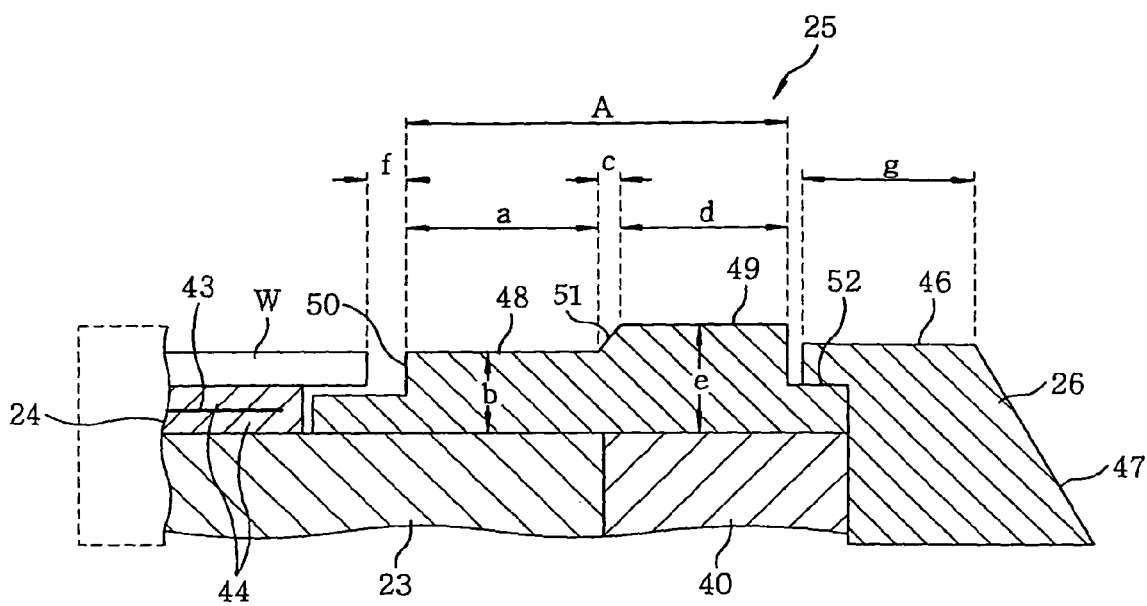
FIG. 7 sets forth a cross sectional view of a part of the ring mechanism shown in FIG. 6.

Referring to FIG. 7, there is illustrated a cross section of a ring mechanism including the inner ring 25 and the outer ring 2. The drawing shows a positional relationship between the top surfaces of the wafer W mounted on the lower electrode 23, the inner ring 25 and the outer ring 26; a height relationship between each top surface. In the inner ring 25 and the outer ring 26, there is prepared a planar surface portion 48 whose top surface is set to be even with the surface of the wafer W (the surface to be processed); a protruded portion 49 formed at the exterior of the planar surface portion 48; and the outer ring 26 disposed at the outer peripheral side of the protruded portion 49 in a manner that the top surface thereof is lower than that of the protruded portion 49.

For example, in case of processing a wafer W having a size of, e.g., 8 inches, the inner ring 25 includes an inner end portion 50 slightly spaced apart from the outer peripheral portion of the wafer W mounted on the lower electrode 23; a first planar surface portion 48 whose top surface is set to be substantially even with the surface of the wafer; a protruded portion 49 formed at the exterior side of the planar surface portion 48; and a taper portion 51 for connecting the planar surface portion 48 and the protruded portion 49.

Further, the exterior side of the protruded portion 49 of the inner ring 25 is formed on a step portion 52 which is lower than the protruded portion 49. An inner end side of the outer ring 26 is mounted on the step portion 52 to fix the inner ring 25.

In case the outer ring 26 is mounted on the step portion 52, the top surface of the outer ring forms a planar surface portion (a second planar surface portion) 46. The top surface of the planar surface portion 46 is substantially even with the top surface of the planar surface portion 48 of the inner ring 25. An exterior side of the planar surface portion 46 of the outer ring 26 is formed as a taper portion (incline) 47.

In the outer ring mechanism, both the inner ring 25 and the outer ring 26 have planar surface portions 48 and 46, respectively, whose top surfaces are substantially even with the surface of the wafer W mounted on the lower electrode 23, and the protruded portion 49 is formed between the planar surface portions 48 of the inner ring 25 and the planar surface portions 46 of the outer ring 26.

As an example of the dimensions of the inner ring 25 and the outer ring 26, in case of the wafer W having the size of, e.g., 8 inches, the entire width A of the inner ring 25 is 29.0 mm; the width a of the first planar surface portion 48 is 18 mm; the thickness b of the first planar surface portion 48 is 6.5 mm; the width of the slope portion 51 is 1 mm; the width d of the protruded portion 49 is 10 mm; the thickness e of the protruded portion 49 is 7.5 mm; the distance f between the wafer W and the inner end portion of the 50 of the inner ring 25 is 1 mm; and the width g of the second planar surface portion 46 is 10 mm.

Herein, the fact that the wafer surface and the top surface of the planar surface portion 48 are set to be substantially even with each other implies that their height are coincident to such an extent that a depth-directional incline of a hole (opening) formed in the resist film by etching is not seen, as will be described later. For example, the difference of the heights of both top-surfaces is within 1 mm. Further, the height of the protruded portion 49 formed between the inner ring 25 and the outer ring 26 is considered adequate if the etching rate of the peripheral region of the wafer is not higher than those of the other regions. For example, its height is allowed to be about 1 mm.

Further, it is proved by verification examples to be described later that in-surface uniformity of etching rate of the resist film is high and no depth-directional incline is formed in the hole formed by the etching if the width a of the planar surface portion 48 of the inner ring 25 is equal to or greater than, e.g., 10 mm.

Provided at an outside of the bellows member 37 disposed at, e.g., the bottom wall of the processing chamber 21, is an gas exhaust port to which a vacuum pump 42 is connected via a gas exhaust line 41. The processing gas within the processing chamber 21 is exhausted by the vacuum pump so that it is exhausted from the vicinity of the lower electrode 23. Since a gas exhaust current flows along the incline 47 of the outer ring 26, the gas is uniformly exhausted from the vicinity of the lower electrode 23. As described, the outer ring 26 has the function of controlling the gas flow within the processing chamber 21.

Further, the upper electrode 22 is installed on an inner top surface wall facing the lower electrode 23 in the processing chamber 21, and has a hollow structure with a plurality of diffusion openings 31 provided on the side of the lower (facing) surface thereof. Connected to the upper electrode 22 is a gas supply line 32, and the processing gas supplied from the gas supply line 32 is diffused in a shape of shower to the inside of the processing chamber 21 via the diffusion openings 31. Under such a configuration, a gas supply region (processing gas atmosphere) facing the entire surface of the wafer is formed between the upper electrode 22 and the lower electrode 23.

Furthermore, the upper electrode 22 is coupled to a high frequency power supply unit 34 via a low pass filter 33. The high frequency power supply unit 34 outputs a high frequency power having a frequency of, e.g., 60 MHz, higher than that of the high frequency power supply unit 39. The low pass filter 33 suppresses a high frequency component applied to the lower electrode 23 from invading the high frequency power supply unit 34.

An annular shield ring 35 formed of quartz is insertion fitted at a peripheral portion around the side of the facing surface of the upper electrode 22, which serves to protect the screws (not shown) for fixing the upper electrode 22 from the plasma.

Subsequently, there will be described a plasma processing operation in the plasma processing device.

First, a wafer W is loaded on the lower electrode 23 in the processing chamber 21 through the opened gate values 29 and 30 from the outside by a transfer mechanism (not shown), and is held thereon by the electrostatic chuck 24. Thereafter, the gate values 29 and 30 are closed. A resist mask is formed on the surface of the wafer W.

Next, after the processing chamber 21 is evacuated by the vacuum pump 42 to a predetermined vacuum level, a predetermined amount of a processing gas, e.g., an etching gas, is introduced thereinto while being uniformly diffused through the diffusion openings 31 of the upper electrode 22.

In the processing chamber 21, an processing gas atmosphere of a certain vacuum degree, e.g., several mTorr to tens of mTorr, is formed under the control of the vacuum pump 42 (or a gas exhaust value not shown). Then, a high frequency voltage of, e.g., 60 MHz, is applied to the process gas atmosphere from the high frequency power supply unit 34 of the upper electrode 22 and, after the elapse of a predetermined time period, e.g., not greater than 1 second, a high frequency voltage of, e.g., 2 MHz, is applied to the process gas atmosphere from the high frequency power supply 39 of the lower electrode 23. By the application of these high frequency voltages, the plasma is generated from the processing gas atmosphere.

Reactive ions in the plasma etch the resist mask of the surface of the wafer and an exposed surface of the wafer W. At this time, oxygen radicals are generated from the outer ring 26 formed of quartz during the etching process, and the oxygen radicals so generated contribute to the etching operation.

Herein, formed at the outer peripheral side of the wafer W is the conductive or semi-conductive inner ring 25 and disposed at the outside of the inner ring 25 is the insulating outer ring 26. Thus, since the dense plasma at the end portion of the wafer is diffused while being attracted by the inner ring and the plasma above the outer ring 26 is also attracted by the inner ring 25, the density of the plasma extending from the end portion of the wafer W to the space above the inner ring can be maintained substantially uniformly.

Figure 8:
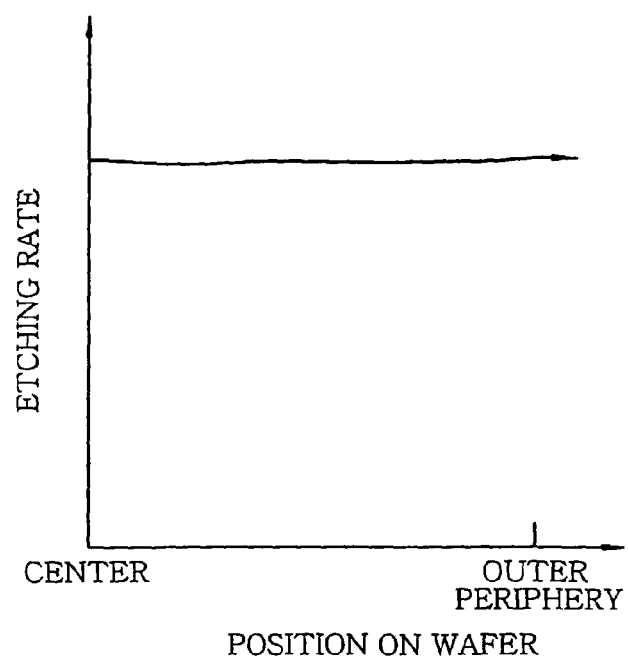
FIG. 8 explains an etching rate characteristic in accordance with the second preferred embodiment.

The inner ring 25 includes the planar surface portion 48 substantially even with the wafer surface and the protruded portion 49 which is slightly higher at the outer peripheral side of the planar surface portion 48. Further, the top surface of the adjacent outer ring 26 is formed to be lower than that of the protruded portion 49. Under such configuration an etching characteristic of the resist mask on the surface of the wafer W is represented in a manner that a rapid increase or decrease of etching rate is suppressed at a peripheral region, for example, as shown in FIG. 8, so that the etching rate becomes uniform over the entire surface of the wafer and, thus, a uniform etching processing can be conducted thereon.

Figure 9A:
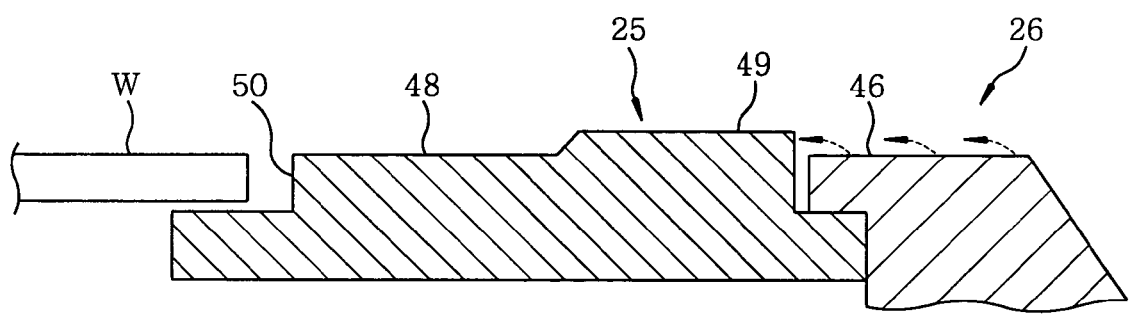
FIGS. 9A and 9B offer cross sectional views describing operation of the ring mechanism in accordance with the second preferred embodiment of the present invention.

Since the top surface of the outer ring 26 is lower than the top surface of the protruded portion 49 as shown in FIG. 9A, the oxygen radicals generated from the outer ring 26 by the plasma etching cannot go over the protruded portion 49 and thus cannot reach a region around the vicinity of the outer peripheral portion of the wafer W. For such reason, it is expected that the rapid increase of the etching rate can be prevented.

Figure 9B:
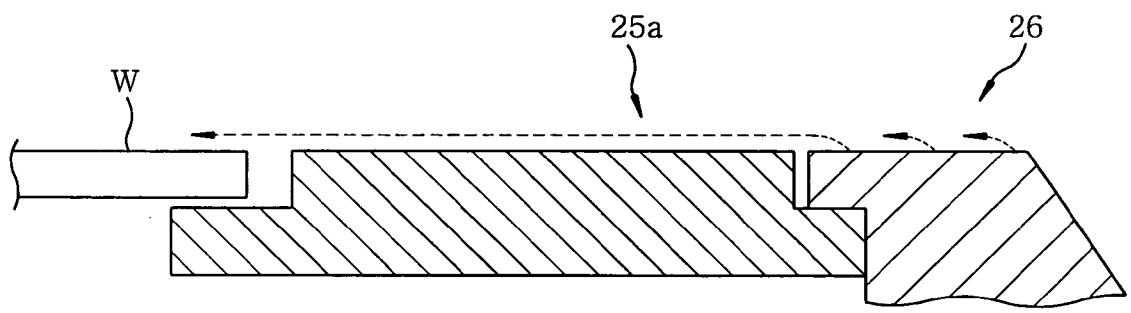

In contrast, as illustrated in FIG. 9B, if the protruded portion 49 is not formed on the inner ring 25, and the top surfaces of the inner ring 25, the wafer W and the outer ring 26 are set to be substantially even with each other, it is expected that the oxygen radicals is directly dispersed to the outer peripheral region of the wafer W from the outer ring 26. In such a region, the resist film is burned out and the etching rate is increased due to heat generated at that time. However, in case the protruded portion 49 is formed on the inner ring 25, since the increase in the etching rate resulting from the burning out of the resist film of the peripheral region of the wafer W can be prevented, the occurrence of the phenomenon of an rapid increase in etching rate may be suppressed.

Figure 10A:
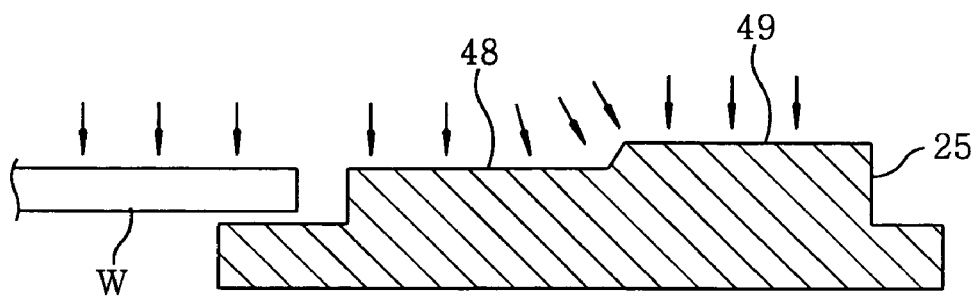
FIGS. 10A to 10C provide cross sectional views further describing operation of the ring mechanism in accordance with the second preferred embodiment of the present invention.

As will become apparent from the following verification examples, such configuration also suppresses a depth-directional slant of a hole formed on the resist film of the top surface of the wafer by the etching of the resist film. Such suppression of the depth-directional slant of the hole is considered to be based on the following reasons. The inner ring 25 is formed of silicon having a high conductivity. Since a top surface adjacent to the wafer of the inner ring 25 is identical to the top surface of the wafer W and the first planar surface portion 48 is set to have a predetermined length, e.g., equal to or greater than 10 mm, an electric field faces the vertically incident direction with respect to the top surface of the inner ring 25 adjacent to the wafer (see FIG. 10A).

Herein, since ions used in the etching move along the direction of the electric field, they also get into the peripheral region of the wafer W in the vertical direction. As a result, holes of the peripheral region of the wafer W are etched vertically. Further, since the electric field faces the vertically incident direction in the peripheral region of the wafer W as well, it is possible to carry out highly efficient plasma processing having a high in-surface uniformity, thereby ensuring a high in-surface uniformity with a high etching rate.

Figure 10B:
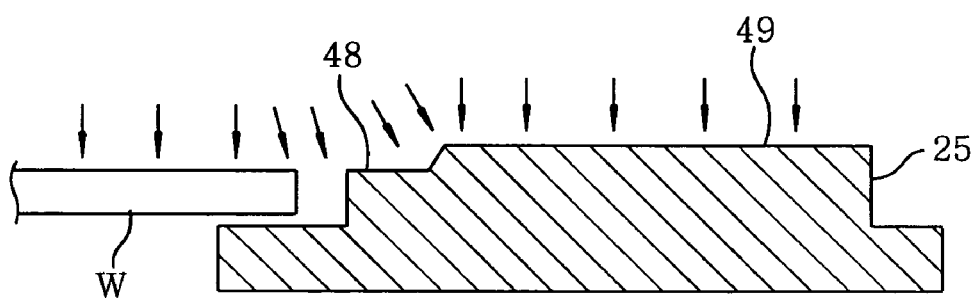

Meanwhile, if the protruded portion 49 of the inner ring 25 is excessively close to the wafer W, the electric field becomes slanted to an incident direction in a slanted state because the inner ring 25 is conductive (see FIG. 10B) As a result, the ions for use in etching get into the peripheral region of the wafer adjacent to the protruded portion 49 at an angle and, thus, the holes of the outer peripheral region of the wafer are etched at a slant. Resultantly, it is expected that the depth-directional inclines are formed in the holes.

Figure 10C:
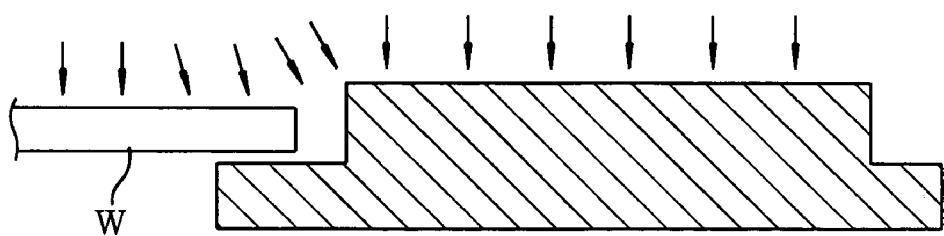

Further, as in the conventional case, if the entire thickness of the inner ring is increased, an electric field vector slants outward as shown in FIG. 10C. As a result, the electric field inclines outward in the peripheral region of the wafer. Since incident electrons move along the direction of the electric field, slanting of the holes occurs. Furthermore, since the ions for use in the etching get into the peripheral region of the wafer at an angle, an etching rate in this region becomes rapidly reduced compared to a region where the ions are entered vertically.

In the preferred embodiment described above, since a uniform plasma process can be performed over the entire surface of the wafer, etching rates within the surface of the wafer can be regulated to be substantially uniform. As a result, a difference in etching rates between the central portion and the peripheral region of the wafer is eliminated, so that the uniformity of line width of a wiring formed by the etching can be obtained. In addition, it is unlikely that a masked surface is exposed before the completion of the etching processing since only a part of the resist mask is etched.

Further, since the etching rates are uniform up to the outer peripheral region of the wafer W, a region for device can be expanded to the vicinity of the peripheral region of the wafer W, which enables an increase in the number of devices formed on a single wafer. Moreover, since dispersion of active species, which is generated from the outer ring 26 by the plasma, toward the peripheral region of the wafer W is suppressed, the influence of the material for the outer ring 26 on the processing of the wafer W is diminished, so that there is a greater degree of freedom in selecting the material for the outer ring 26.

In the following, a third preferred embodiment of the present invention will be described.

Figure 11:
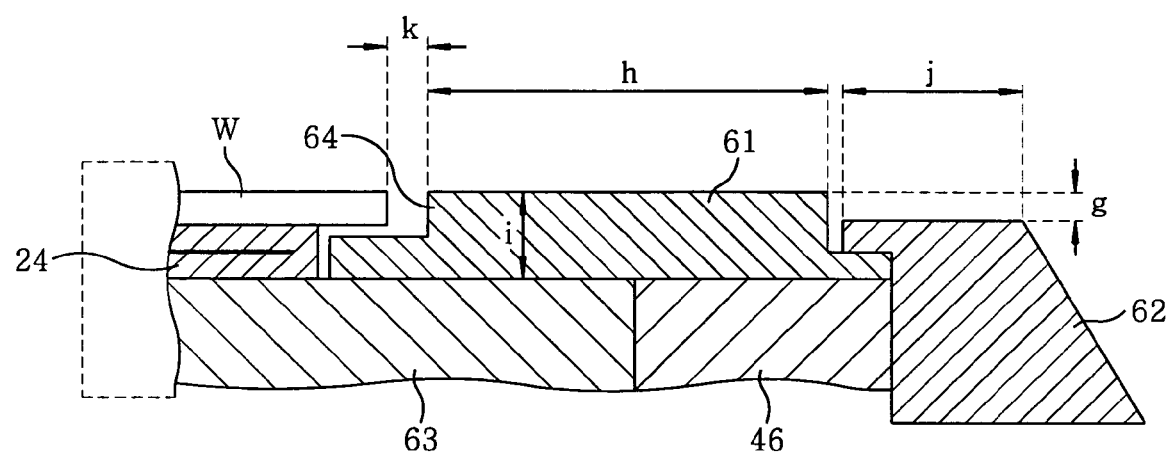
FIG. 11 presents a cross sectional view of a ring mechanism in accordance with a third preferred embodiment of the present invention.

FIG. 11 provides a cross sectional view of a ring mechanism in accordance with the third preferred embodiment of the present invention.

The protruded portion is formed on the top surface of the inner ring 61 in the second embodiment described above, but a height of the top surface of an outer ring 62 is set to be lower than that the top surface of an inner ring 61 by, e.g., 1 mm, in this embodiment. The height difference is not limited to 1 mm but can be set within a range where the etching rate of the peripheral portion of the wafer is not higher than those of the other regions.

To exemplify sizes of the inner ring 61 and the outer ring 62 having the flat top surface in FIG. 11, the width h and the thickness i of the inner ring 61 is set to be 29 mm and 6.5 mm, respectively; the width j of a flat surface of the outer ring 62 is set as 10 mm; the distance k between an inner end portion 64 of the inner ring 61 and an outer peripheral portion of the wafer W mounted on an electrostatic chuck 24 is set to be 1 mm; and a height difference between the inner ring 61 and the outer ring 62 is set to be 1 mm.

Under such a configuration, since oxygen radicals generated from the outer ring 62 during a plasma process cannot go over the inner ring 61, it is unlikely that there occurs a phenomenon in which a peripheral region of the wafer W is burned out by the oxygen radicals. Therefore, etching rates can be substantially uniformly set over the entire surface of the wafer, thereby enabling a uniform processing.

In the following, there will be described a first and a second verification example for confirming the effects of the second embodiment and the third embodiment, respectively.

VERIFICATION EXAMPLE 1

First, as shown in FIGS. 12A to 12E, five types of inner rings 25, 64, 65, 66 and 67 (the inner rings 65 to 67 do not have a protruded portion) were prepared and etching was conducted under the same processing condition for each case. Then, uniformity of etching processing was inspected.

<Experimental Conditions for Verification>

Figure 12A:
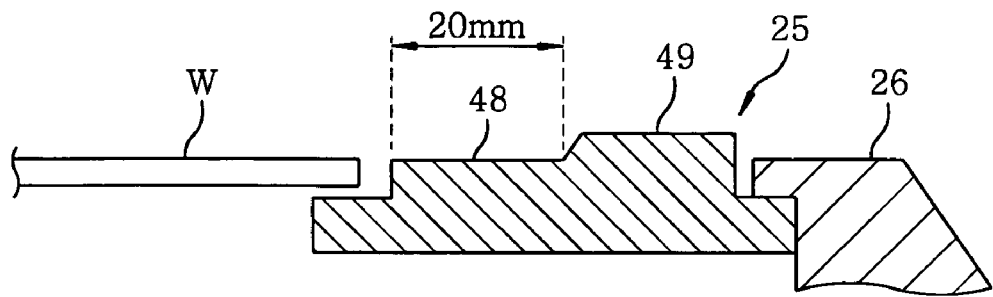
FIGS. 12A to 12E represent cross sectional views of ring mechanisms describing a first verification example.

The type in FIG. 12A (experimental example 1) shows an inner ring 25 of a type described in the foregoing preferred embodiments, wherein a length a and a thickness of the planar surface portion 48 was 20 mm and 6.5 mm, respectively; and the thickness of the protruded portion 49 was 7.5 mm.

Figure 12B:
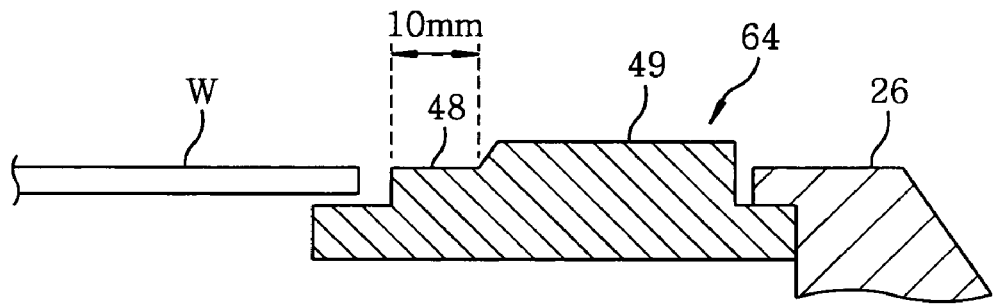

The type in FIG. 12B (experimental example 2) illustrates an inner ring 64 which is identical to that of the experimental example 1 with an exception of the length of the planar surface portion 48 which was 10 mm.

Figure 12C:
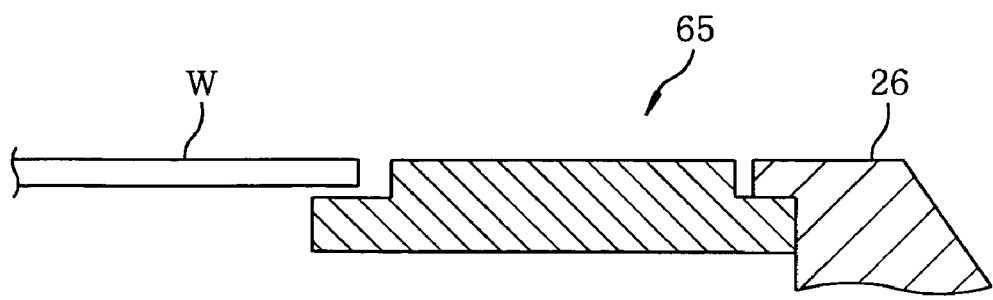

The type in FIG. 12C (comparative example 1) shows a flat inner ring 65 having a thickness of 6.5 mm and the surface of the inner ring 65 is substantially identical to the surface of the wafer.

Figure 12D:
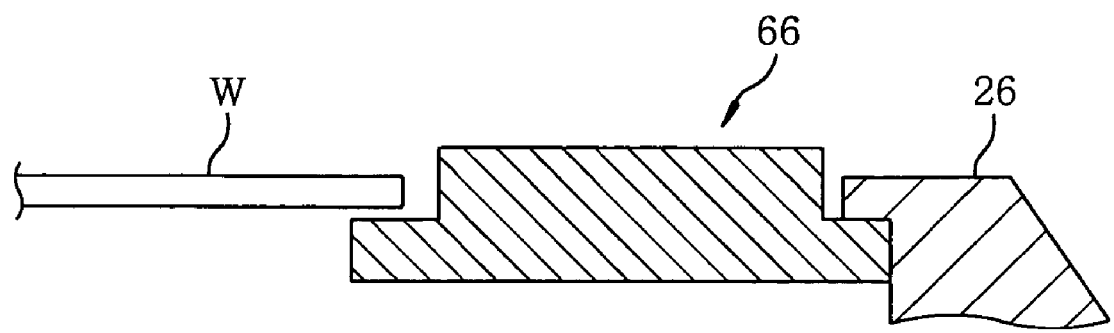

The type in FIG. 12D (comparative example 2) illustrates a flat inner ring 66 having a thickness of 7.5 mm and the surface of the inner ring 66 higher than the surface of the wafer W.

Figure 12E:
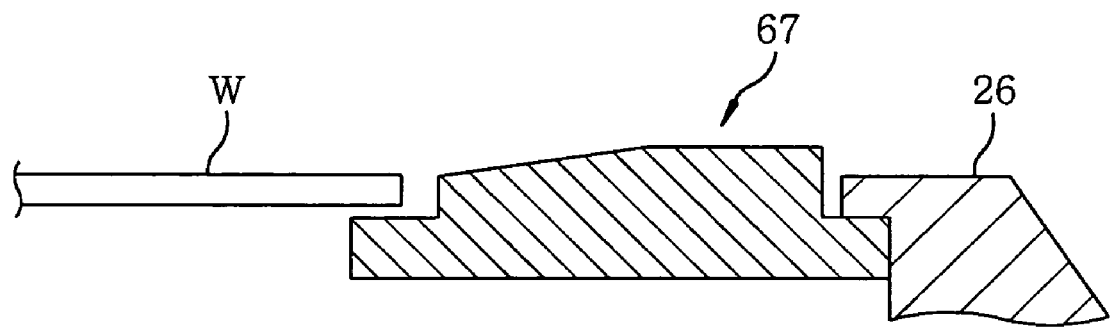

The type in FIG. 12E (comparative example 3) shows an inner ring 67 which was of a slope shape gradually heightened from an inner side toward an outer side thereof, wherein the thickness of the inner side was 6.5 mm while the thickness of the outer side was 7.5 mm, thus changing from a state where the thickness is substantially equal with the height of the top surface of the wafer to a state where it was higher than thereof.

At this time, the processing condition was set as follows and the same experiments were conducted while varying process pressures for each of the inner rings 25, 64, 65 and 66 of the experimental examples 1 and 2 and the comparative examples 1 and 2, respectively. Further, uniformity of etching processing was evaluated through the steps of determining 37 measurement points on the surface of the wafer; measuring etching rates thereof; obtaining the maximum, the minimum and the mean value thereof; and then calculating (the maximum−the minimum)/(2×the mean value).

<Processing Condition>

A high frequency voltage applied to the upper electrode: 2170 W

A high frequency voltage applied to the lower electrode: 1800 W

Composition of the etching gas: $C_5F_8$ gas/Ar gas/$O_2$ gas=15 sccm/380 sccm/19 sccm Etching period: 1 minute Process pressures: 15 mTorr, 25 mTorr, 35 mTorr, 50 mTorr <Result of Verification>

The result provided in FIG. 13 shows that the uniformity of the etching processing was improved when the inner rings of the types shown in the experimental examples 1 and 2 and the comparative example 2 were employed in contrast to the case where the inner ring of the type in the comparative example 1 was used.

Figure 14A:
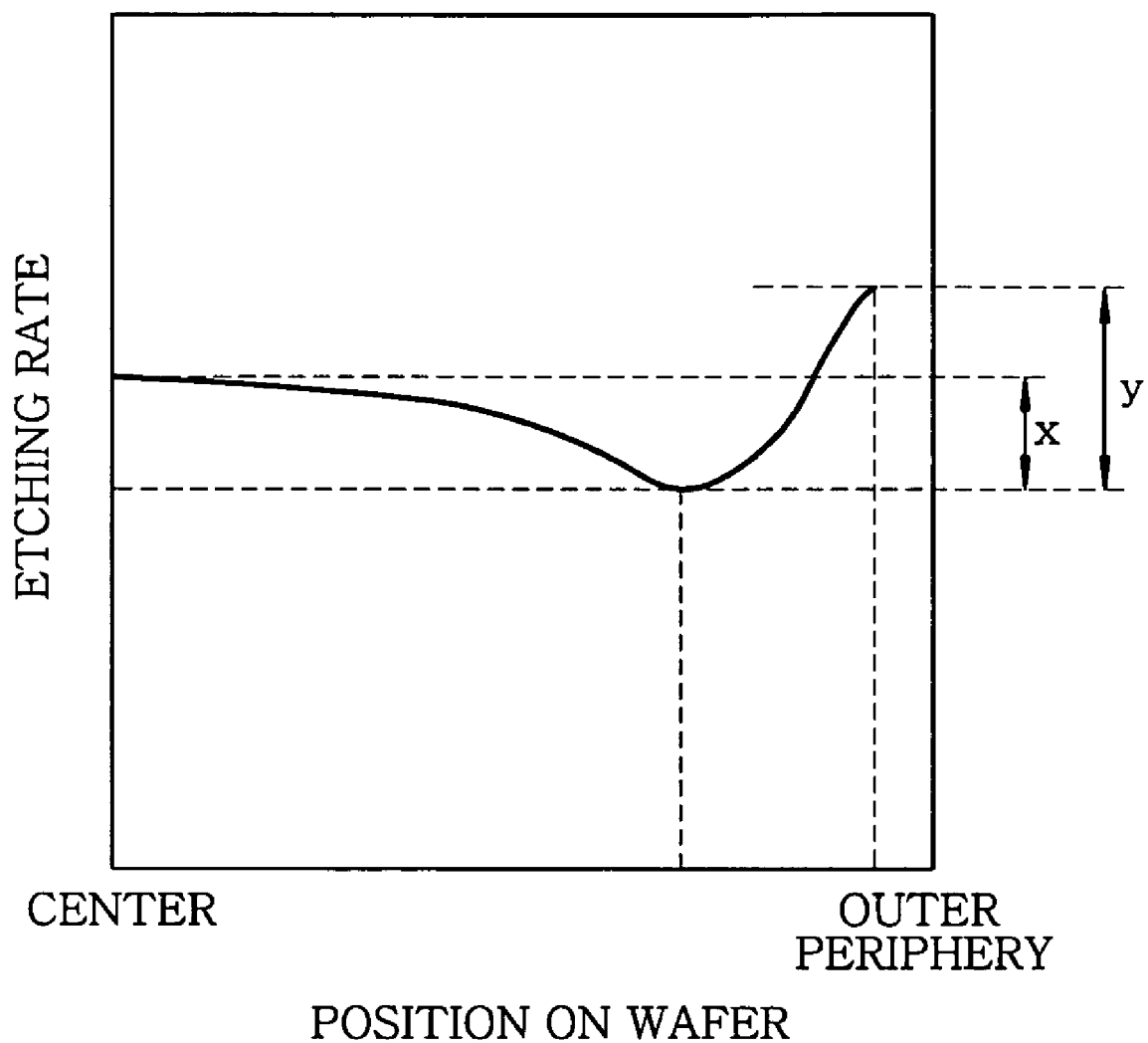
FIGS. 14A and 14B provide etching rate characteristics in the first verification example.
Figure 14B:
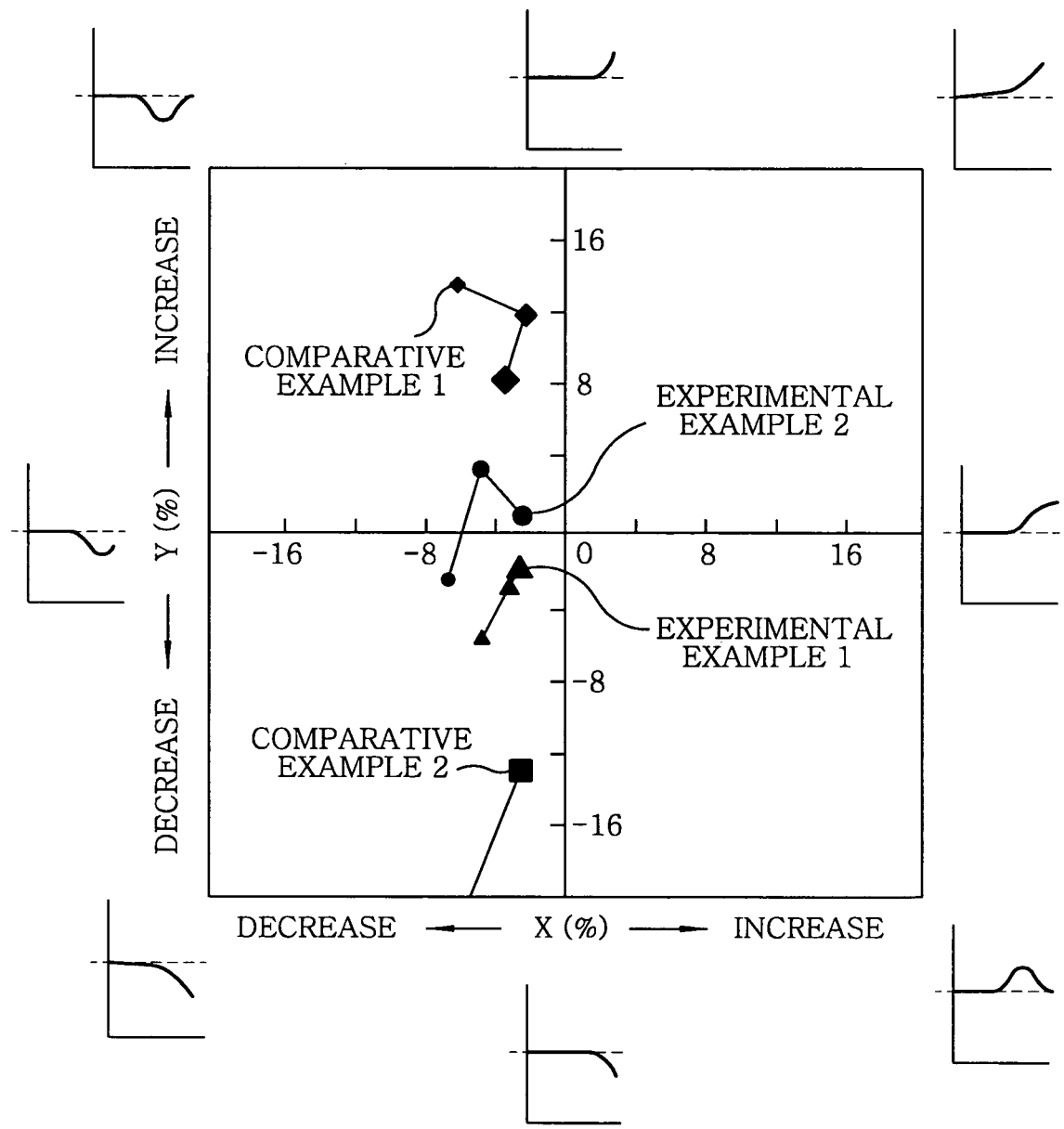

Further, results provided in FIGS. 14A and 14B were obtained by digitizing a distribution configuration of etching rates on the wafer surface numerically. In FIG. 14B, the largest plot (the largest ▲ in the experimental example 1, for example) was found to be 15 mTorr; the smallest plot was observed to be 35 mTorr; and the medium plot was found to be 25 mTorr.

Further, x in FIG. 14A represents a difference in etching rates between a center of the wafer and a position 15 mm inward from an outer end portion of the wafer while y represents a difference in etching rates between the position 15 mm inward from the outer end portion of the wafer and a position 3 mm inward therefrom, wherein the distribution is flatter as the values of x and y are smaller and the uniformity is observed to be higher as the values of x and y become closer to the origin (0,0). In addition, the shape of etching rate distribution is represented around each area of the graph.

From the above result, the etching rate distributions of the experimental examples 1 and 2 were plotted at positions close to the origin and the uniformity of etching rate was found to be improved in both cases in comparison with the comparative examples 1 and 2. Further, since the degree of transition in data is smaller in the experimental examples 1 and 2 than those of the comparative examples 1 and 2, it is understood that the pressure-dependency of uniformity of etching rate is lowered.

Figure 15:
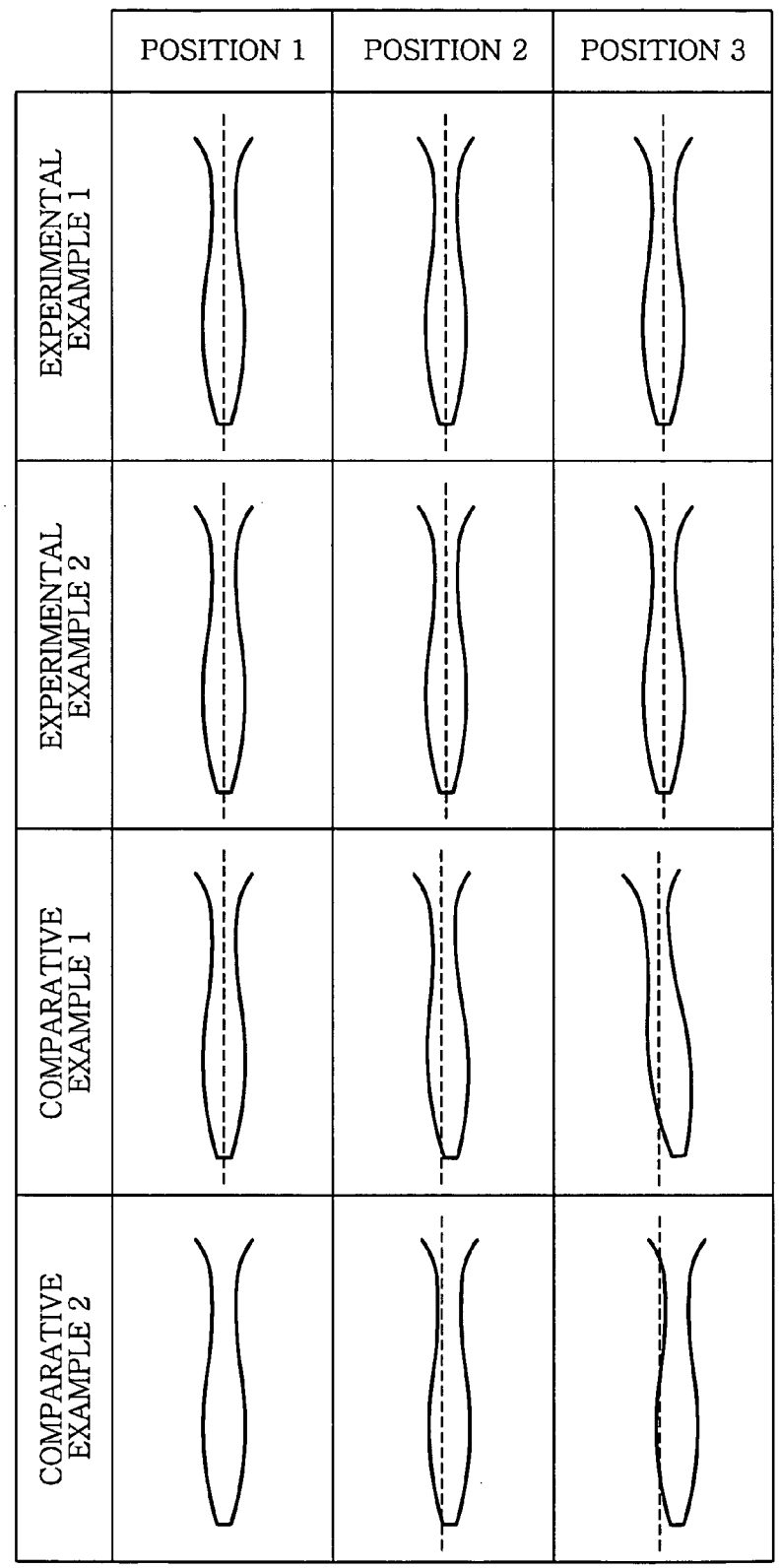
FIG. 15 illustrates exemplary shapes of holes in the first verification example.

Further, etching processing for forming holes having a width of 0.3 μm and a depth of 2 μm with 1.2 μm interval were carried out by employing the inner rings of experimental examples 1, 2 and the comparative examples 2, 3 under the above-described processing conditions. Then, the shapes of the holes were inspected by a cross sectional SEM and the result is provided in FIG. 15. Herein, "Position 1" is the center of the wafer; "Position 2" is a position 4.0 mm inward from the outer end portion of the wafer; and "Position 3" is a position 2.5 mm inward from the outer end portion of the wafer.

As can be seen from the result, slanting of the holes were found at the positions 4.0 mm and 2.5 mm inward from the outer end portion of the wafer in the case of employing the inner rings of the comparative examples 1 and 2, unlike in the case of using the inner rings 25 of the experimental examples 1 and 2 where no slanting was found up to the position 2.5 mm inward from the outer end portion of the wafer.

The reason why the slanting of the holes occurred by the inner rings 66 and 67 is as follows. The electric field is slanted outward in the vicinity of the outer end portion of the wafer W in the comparative example 2 and the electric field is slanted along a slant because the slant is long in the comparative example 3. If the electric field is slanted, the incident direction of ions for use in etching is also slanted in the same direction with the direction of the electric field, so that an extension direction of the holes in each case is slanted as well.

From the above-described verification, it was proved that a constant etching rate characteristics without a rapid increase or decrease of etching rate can be obtained and slanting of a hole can be prevented by way of forming the inner side of the inner ring 25 as the planar surface portion 48 substantially even with the wafer surface and the outer side thereof as the protruded portion 49 whose surface is higher than the planar surface portion 48; and setting the entire width of the inner ring 25, the height of the protruded portion 49 and the length of the planar surface portion 48 to be 29 mm, about 1 mm, and equal to or greater than 10 mm, respectively, thereby realizing uniform etching.

VERIFICATION EXAMPLE 2

<Experimental Conditions for Verification>

In this verification example, inner rings and outer rings of types illustrated in FIGS. 16A, 16B and FIGS. 17A and 17B were prepared, and etching was conducted under the same processing condition for each case. Then, uniformity of etching process was inspected.

Figure 16A:
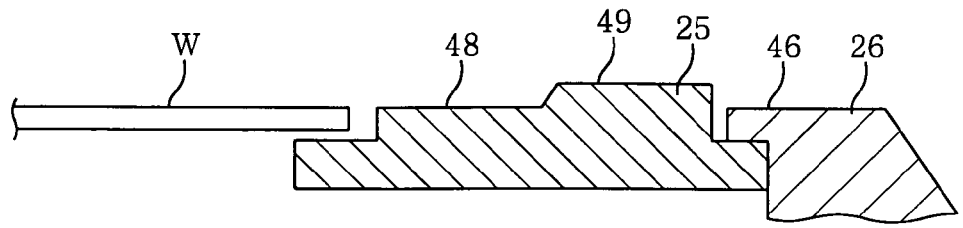
FIGS. 16A and 16B show cross sectional views of cover ring mechanisms describing a second verification example.

The type in FIG. 16A (experimental example 3) shows an inner ring 25 of a type described in the first preferred embodiment, wherein the length a and the thickness of a planar surface portion 48 was 20 mm and 6.5 mm, respectively; the thickness of a protruded portion 49 was 7.5 mm; and the height of the top surface of an outer ring 26 was set to be lower than that of the top surface of the protruded portion 49 by 1 mm.

Figure 16B:
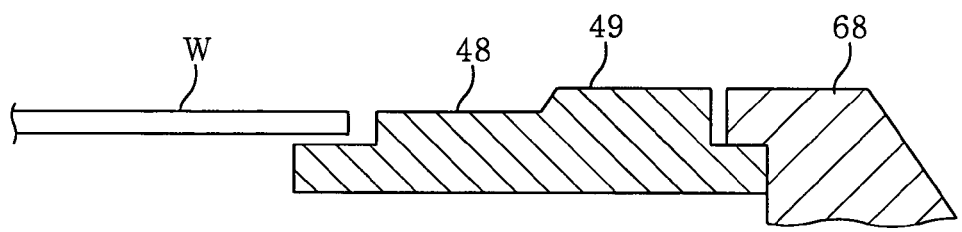

The type in FIG. 16B (comparative example 4) illustrates an inner ring 25 identical to that employed in the experimental example 3, wherein the height of the top surface of an outer ring 68 is set to be substantially identical to that of the top surface of a protruded portion 49.

Figure 17A:
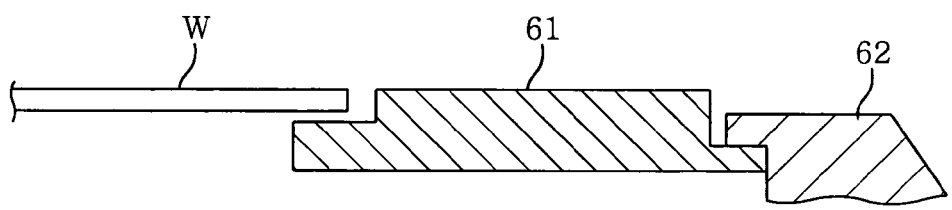
FIGS. 17A and 17B further present cross sectional views of cover ring mechanisms in the second verification example in addition to those shown in FIGS. 16A and 16B.

The type in FIG. 17A (verification example 4) shows an inner ring 61 with no protruded portion whose width and thickness was 29 mm and 6.5 mm, respectively, wherein the height of the top surface of an outer ring 62 is set to be lower than that of the top surface of the inner ring 61 by 1 mm.

Figure 17B:
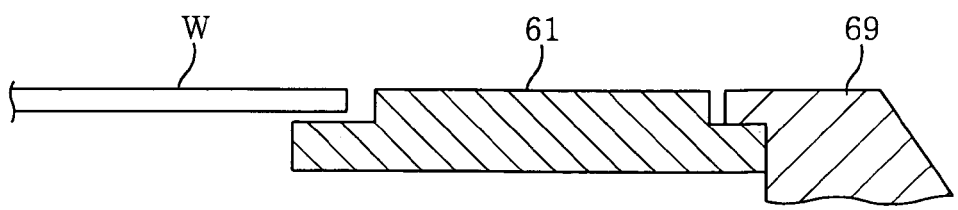

The type in FIG. 17B (comparative example 5) illustrates an inner ring 61 having an outer step portion thicker than that of the experimental example 4, wherein the height of the top surface of an outer ring 69 is set to be substantially identical to that of the top surface of a wafer W.

Etching condition was set as follows and the same experiments were conducted while varying process pressures. Further, the uniformity of etching processing was calculated in the same way as employed in the comparative example 1.

<Etching Condition>

A high frequency voltage applied to the upper electrode: 2170 W

A high frequency voltage applied to the lower electrode: 1800 W

Composition of etching gas: $C_5F_8$ gas/Ar gas/$O_2$ gas=15 sccm/380 sccm/19 sccm Etching period: 7 minutes 30 seconds Process pressures: 15 mTorr, 25 mTorr, 35 mTorr <Result of Verification>

Figure 18:
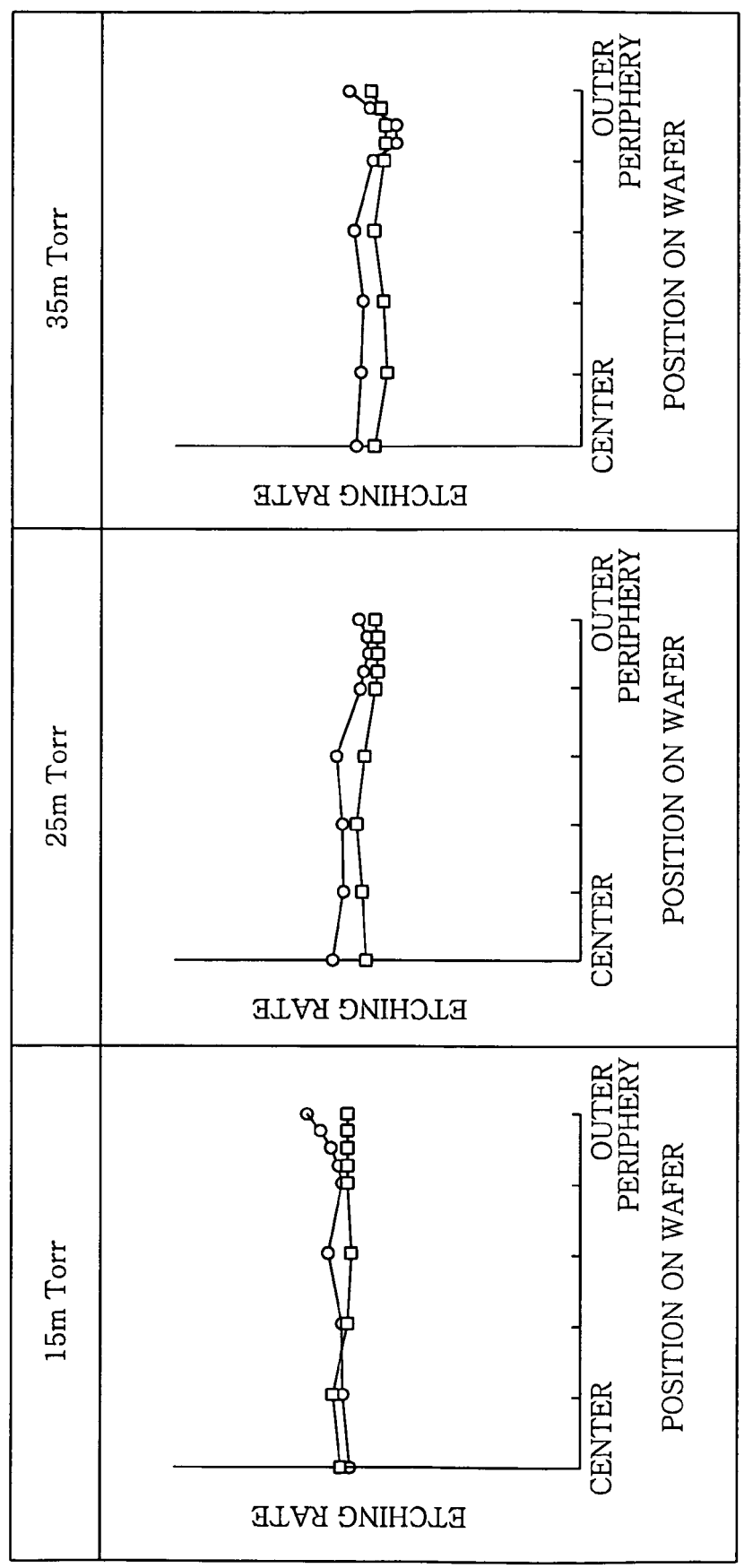
FIG. 18 describes etching rate characteristics at different vacuum levels in the second verification example.
Figure 19:
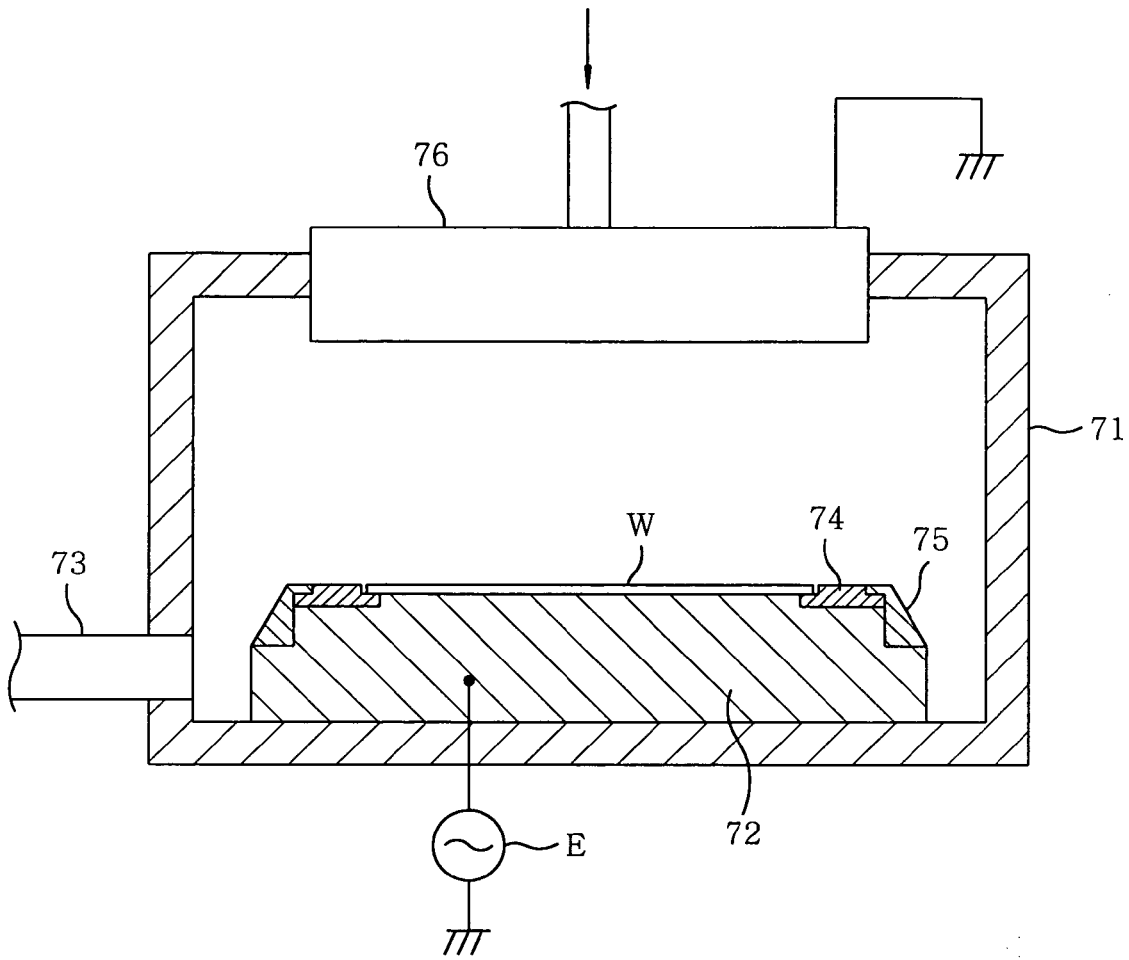
FIG. 19 is an exemplary cross sectional view of a plasma processing device employing a conventional ring mechanism.
Figure 20:
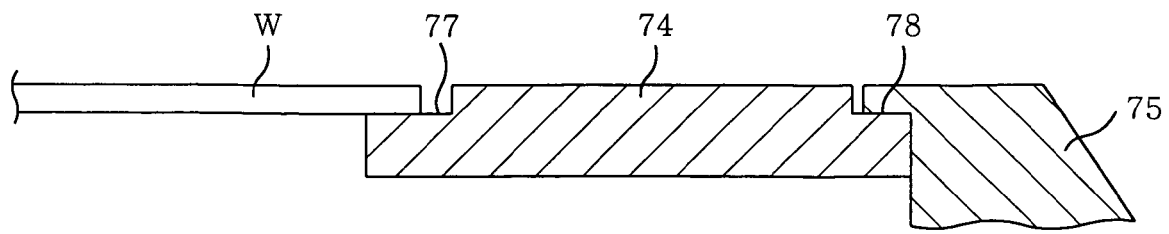
FIG. 20 depicts a cross sectional view of the conventional ring mechanism.
Figure 21:
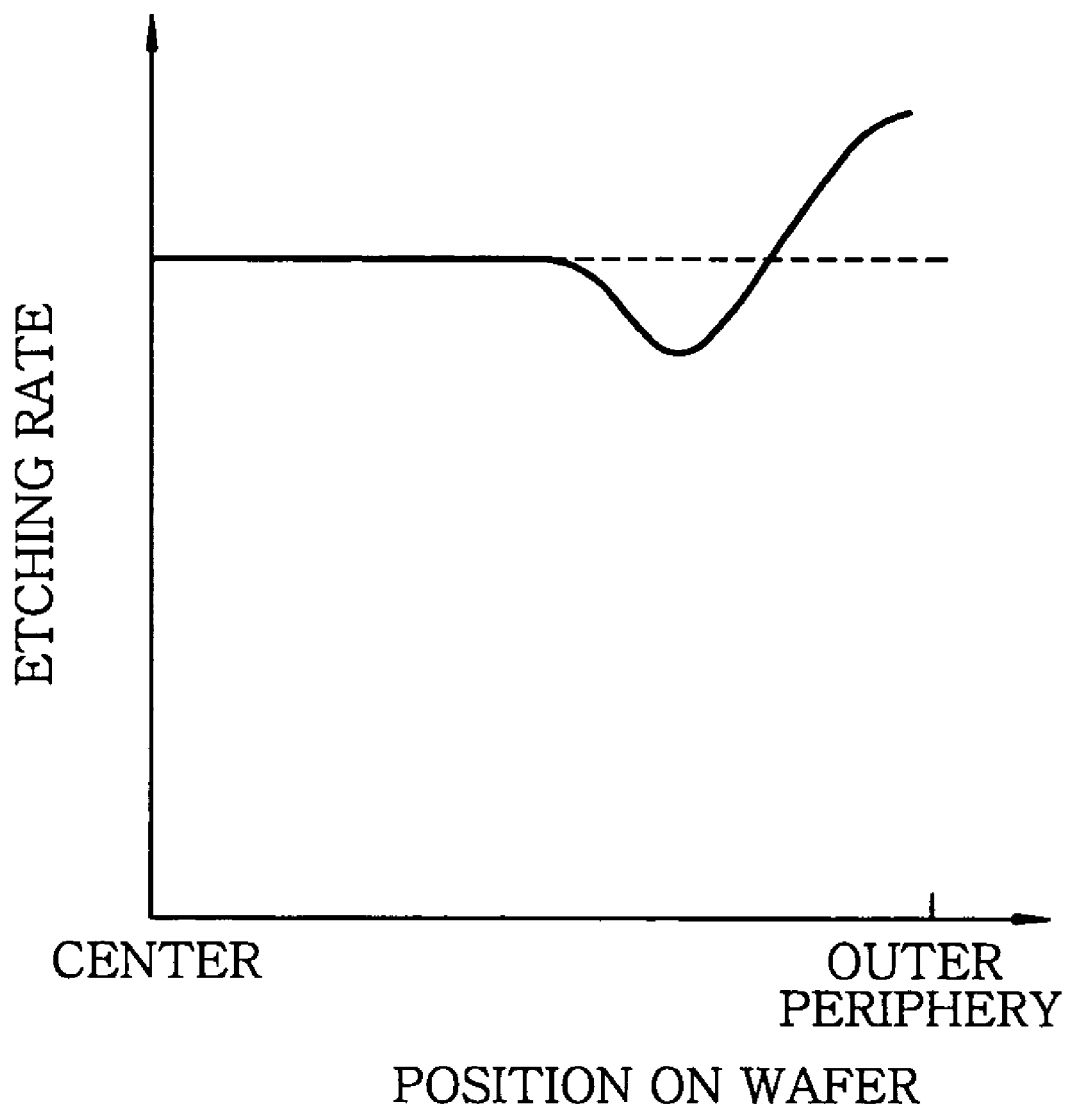
FIG. 21 explains etching rate characteristics in the conventional ring mechanism.

Results of the experimental example 3 and the comparative example 4 were described in FIG. 18 by using symbols □ and ○, respectively. This characteristic graph shows that uniformity of etching is improved as a range of variation gets smaller and it was observed that the range of variation was smaller and the uniformity of the etching rate was higher in the experimental example 3. Further, in comparing the experimental example 4 and the comparative example 5, it was also observed that the range of variation was smaller and the uniformity of the etching rate was higher in the experimental example 4.

From the results described above, it was observed that a rapid increase or decrease of the etching rate in the peripheral region of the wafer can be suppressed by way of setting the top surface of the outer ring to be lower than that of the inner ring, thereby ensuring an in-surface uniformity with a high etching rate.

Further, it was examined whether or not a depth-directional slanting of holes formed by etching was generated in the experimental examples 3 and 4, and no such slanting of the holes was found.

Though the present invention has been described by exemplifying the etching processing as a plasma processing in the above, the present invention can also be applied to a plasma processing device of another type, e.g., a plasma CVD apparatus, a plasma ashing apparatus, a plasma sputter apparatus, etc. Further, the method for generating plasma is not limited to the configuration employed in the present invention but can be of a type of generating plasma by way of applying a high frequency power by a high frequency antenna of a coil type. Moreover, the to-be-processed object is not limited to the semiconductor wafer but can be, e.g., a LDC substrate.

In accordance with the second and the third preferred embodiment, by optimizing the shapes of a focus ring (inner ring: a first ring) and a cover ring (outer ring: a second ring), the influence of oxygen radicals can be suppressed during a plasma processing, thereby carrying out a uniform plasma processing over the entire surface of the to-be-processed object.

Next, a fourth preferred embodiment of the present invention will now be described.

Figure 22:
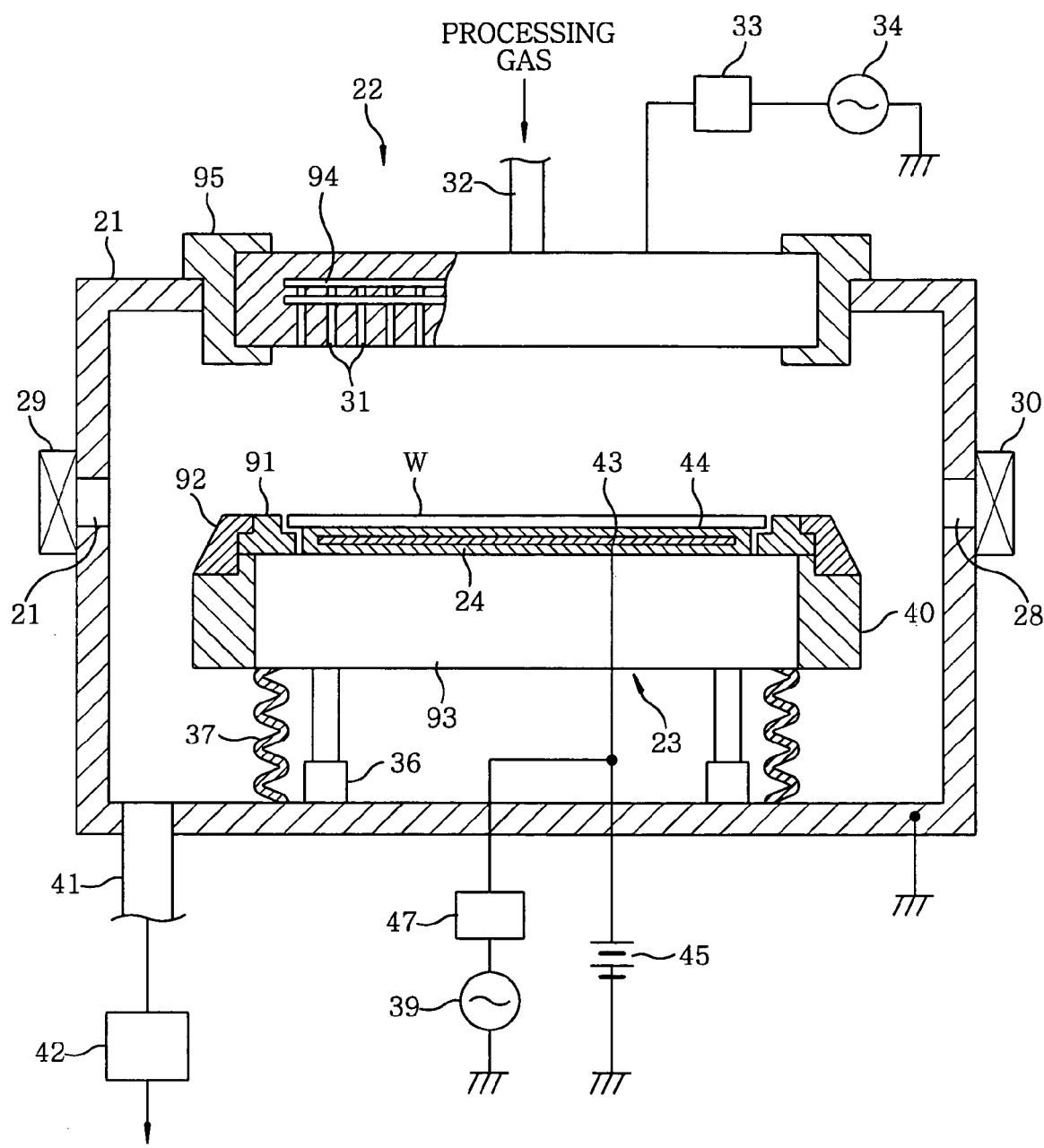
FIG. 22 sets forth a schematic cross sectional view of a plasma processing device employing a ring mechanism in accordance with a fourth preferred embodiment of the present invention.
Figure 23:
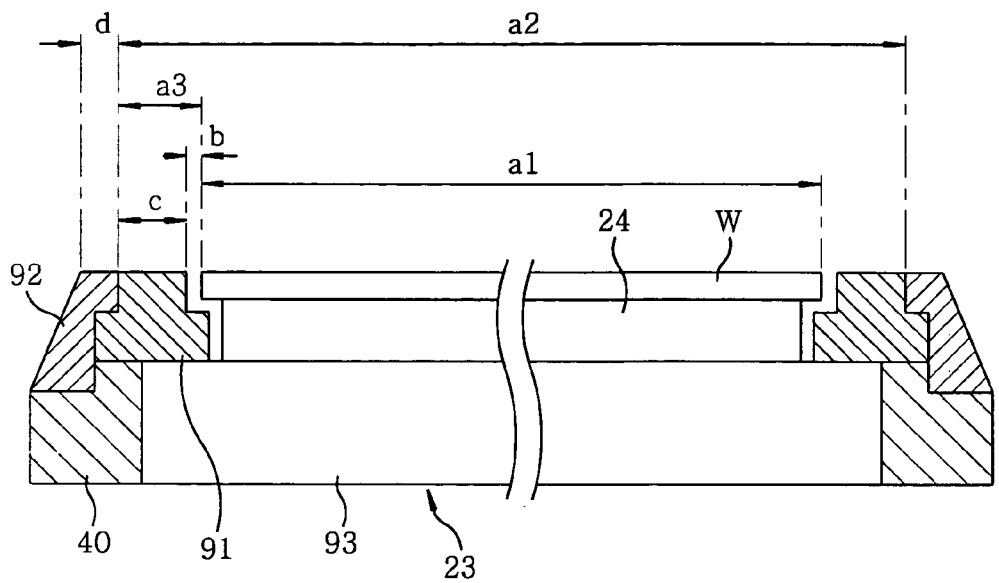
FIG. 23 provides dimensions of main parts of an electrode and a ring mechanism in accordance with the fourth preferred embodiment of the present invention.

Referring to FIG. 22, there is provided a cross sectional view describing a schematic configuration of a plasma processing device accommodating therein a ring mechanism in accordance with the fourth embodiment. FIG. 23 explains dimensions of main parts of electrodes and the ring mechanism in the fourth embodiment. Further, parts that are identical to those described in FIG. 5 will be assigned like reference numerals, and explanations thereof will be omitted.

The plasma processing device includes a processing chamber 21 capable of maintaining a vacuum state therein in which an upper electrode 22 also serving as a gas shower head and a lower electrode 23 further serving as a susceptor of a wafer W are disposed facing each other. The upper electrode 22 has a plurality of diffusion openings 31 formed at a side of an facing surface thereof, and a processing gas or the like is uniformly diffused and introduced via a gas diffusion plate 94, thereby forming an atmosphere of the processing gas.

Connected to the upper electrode 22 via a low pass filter 33 is a high frequency power supply unit 34 for supplying a high frequency power of, e.g., 60 MHz. Further, an annular shield ring 95 formed of quartz is insertion fitted around a peripheral portion of the upper electrode 22.

Formed on a sidewall of the processing chamber 21 are openings 27 and 28 for use in loading and unloading of the wafer W. Installed at the outside of the openings 27 and 28 are gate valves 29 and 30, respectively, for opening and closing the openings 27 and 28.

The upper electrode 22 includes a cylindrical support member 93 made of, e.g., aluminum; and an electrostatic chuck 24 mounted on a top surface of the support member 93, and is vertically moved by an elevation mechanism 36 installed at a lower part of the processing chamber 21. Provided between the vicinity of the elevation mechanism 36 and an inner wall of a bottom wall of the processing chamber 21 is a bellows member 37, which prevents plasma generated within the processing chamber 21 from getting below the lower electrode 23. The electrostatic chuck 24 includes a sheet-shaped conductive electrode plate 43 and a dielectric polyimide layer 44 for covering the entire surface of the electrode plate 43, wherein the electrode plate 43 is electrically coupled to a DC power supply unit 45 for generating a Coulombic force for use in temporarily maintaining the wafer W.

Further, the lower electrode 23 is connected to a high frequency power supply unit 39 for supplying a voltage for bias having a frequency of, e.g., 2 MHz via a high pass filter 38 for preventing an invasion of a high frequency component applied to the upper electrode 22. In this example, a voltage supply line taken from the high frequency power supply unit 39 is connected to the electrode plate 43 An annular bellows member 40 formed of, e.g., quartz is installed around the support member 93 in a manner that the height of the top surface of the support member 93 is identical to each other. Provided around the wafer W on the top surface of the lower electrode 23 (specifically, the top surface of the electrostatic chuck 24) is an annular first ring (focus ring: identical to the inner ring 25) 91 which is formed of a conductive material, e.g., silicon Si, and extends over the support member 93 and the base body 40. The first ring 91 serves to diffuse dense plasma of the peripheral portion of the wafer W and vicinity thereof to thereby improve uniformity of the plasma. Thus, the first ring 91 is preferably formed of, e.g., silicon, of 2 Ω with a high electric conductivity, but it is not limited to the conductive material but can be formed of a semi-conductive material.

A second ring (cover ring: identical to the outer ring 26) 92 is disposed at a periphery of the first ring 91 in such as manner as to be located on a top surface of the base body 40 so as to surround the first ring 91. The first ring 91 and the second ring 92 are formed to be concentric with the wafer W mounted on, e.g., the lower electrode 23.

In addition to serving as a cover ring for pressing the first ring 91 toward the lower electrode 23 and the base body 40, the second ring 92 also functions to collect the plasma spread slight inward of the first ring to thereby improve the uniformity of plasma extending from the peripheral portion of the wafer W to the space above the first ring 91, thereby further improving the uniformity of the plasma of a peripheral region of the wafer W. Moreover, the second ring 92 also has a function of controlling a flow of the processing gas within the processing chamber 21 as will be described later. Moreover, in case the second ring 92 is formed of quartz, it also has a function of facilitating the etching of the wafer W by oxygen radicals generated in etching of the quartz, as will be described later.

Referring to FIG. 23, dimensions concerning the wafer W, the first ring 91 and the second ring 92 will be described. The wafer W has a size of, e.g., 8 inches and diameter thereof a1 is 200 mm. Further, an outer diameter a2 of the first ring 91 is an important factor in this embodiment. Since the outer diameter a2 increases the in-surface uniformity of the etching rate of the peripheral region of the wafer W and prevents the uniformity from being dominated by varying of the pressure, the outer diameter a2 is set to range from 245 mm to 260 mm. Herein, the outer diameter a2 of the first ring 91 refers to an outer diameter of a space exposed to a plasma processing space, i.e., the region of the portion serving to spread the plasma in the vicinity of the peripheral portion of the wafer W as described before, excluding the portion covered by the cover ring 92.

In this fourth preferred embodiment, a ring width a3 of the first ring 91 ranging from an inner peripheral portion of the first ring to an outer peripheral portion thereof is required to be 22.5 mm to 30 mm. And, the first ring 91 is installed close to the wafer W and the distance therebetween, i.e., a distance b between the outer peripheral portion of the wafer W and the inner peripheral portion of the first ring 91 is determined to range, for example, from 0 mm to 2 mm, preferably, 1 mm.

Accordingly, the ring width c of the first ring 91 is set to range from 21.5 mm to 29 mm. Further, the ring width d of the second ring 92 is set to be, e.g., 10 mm. The ring width d refers to a width of a portion of the second ring 92 which serves to collect the plasma inward, e.g., a flat top surface portion.

A vacuum pump 42 is connected to, e.g., an exterior of the bellows member 37 on the bottom wall of the processing chamber 21 via a gas exhaust line 41 and the processing gas in the processing chamber 21 is exhausted from the vicinity of the lower electrode 23. At this time, the exhaust current flows along a lateral tapered surface of the second ring 92, by which it is uniformly exhausted from the vicinity of the lower electrode 23. As such, the second ring 92 functions to control the gas flow within the processing chamber 21.

Next, operation of the plasma processing device will be explained.

First, the gate value 29, for example, is opened and a wafer W is loaded into the processing chamber 21 from a load lock chamber (not shown). Then, the wafer W is mounted on the electrostatic chuck 24 of the lower electrode 23 and the gate valve 29 is closed. Such transfer of the wafer W is carried out by cooperation of an arm (not shown) and an elevation pin (not shown) installed at a side of the lower electrode 23. At this time, the loaded wafer W has a resist mask formed on the surface thereof, wherein a film to be etched is, for example, a silicon oxide film. Then, the lower electrode 23 is elevated close to the upper electrode 22 by the elevation mechanism 36.

Aftrward, the processing chamber 21 is evacuated to a predetermined vacuum level by the vacuum pump 42 through the gas exhaust line 41. In the meantime, a processing gas, i.e., an etching gas, e.g., a gaseous mixture of a $C_5F_8$ gas, an Ar gas and an $O_2$ gas is supplied via the gas supply line 32 at a predetermined flow rate and then is uniformly diffused through the diffusion openings 31 of the upper electrode 33.

Thus, a processing gas atmosphere of a vacuum degree of, e.g., several tens of mTorr is generated in the processing chamber 21. Then, a high frequency voltage of, e.g., 60 MHz, is applied between the upper electrode 22 and the lower electrode 23 from the high frequency power supply unit 34, thereby converting the etching gas into plasma. Further, after the elapse of not longer than 1 second from that time, a high frequency voltage for a bias of, e.g., 2 MHz is applied to the lower electrode 23 from a high frequency power supply 39.

Meanwhile, reactive ions in the generated plasma are irradiated on the surface of the wafer W where the high frequency bias is applied, whereby the resist mask formed on the surface of the wafer and the underlying silicon oxide film are etched with a predetermined selectivity. At this time, the second ring 92 formed of quartz is etched to generate oxygen radicals and the oxygen radicals are employed in the etching of the resist mask on the surface of the wafer.

Further, since the dense plasma in the vicinity of the outer peripheral portion of the wafer W is diffused with a state attracted by the first ring 91, and the second ring 92 injects the plasma inward, the density of the plasma extending from the peripheral portion of the wafer W to the space above the first ring 91 can be made substantially uniform.

This embodiment is based on the discovery that the etching rate in the outer peripheral region of the wafer W, e.g., the region ranging from the outer peripheral portion of the wafer W to the position 10 mm inward from the peripheral portion of the wafer W and the influence of a process pressure thereon depends on the ring width of the wafer W from the outer peripheral portion of the wafer W (or the distance a3 to the outer peripheral portion), which is set to be 15 mm to 35 mm, preferably 22.5 mm to 30 mm. Further, referring to FIG. 23, in a wafer of, e.g., 200 mm, the distance a3 to the outer peripheral portion, the ring width c, the ring width d and the entire outer diameter a2 are set to be 22.5 mm to 30 mm, 21.5 mm to 29 mm, 10 mm and 245 mm to 260 mm, respectively.

By setting the ring width (or the distance a3), since the etching rates of the resist can be same between the peripheral region of the wafer W and the inner region thereof as will become apparent from the following experimental results and the size of openings can be uniformalized over the entire surface, an etching process featuring a high uniformity and having the same line widths of a pattern in a surface can be carried out. In addition, since a difference between a change of the etching rate caused by pressure at the outer peripheral portion of the wafer and a change of the etching rate caused by a pressure at the inner region thereof becomes smaller though the process pressure fluctuates, the influence of the pressure on the in-surface uniformity of the etching rate can be reduced. Accordingly, the margin of the process pressure can be set to be large, so that it becomes easier to adjust the selectivity of the etching rates of the resist mask and the to-be-etched film by way of just changing, e.g., the pressure during the process. The present preferred embodiment is not limited to the etching of the silicon oxide film but can be applied to etching of polysilicon or silicon nitride.

In the following, effects of the fourth preferred embodiment will be verified.

EXPERIMENTAL EXAMPLE 1

A. Experimental Condition

The plasma processing device shown in FIG. 22 was employed. Six types were prepared by setting the width c of the first ring 91, which ranges from the inner peripheral portion defined as 0 to the outer peripheral portion thereof, to be 7.5 mm, 17.5 mm, 22.5 mm, 25 mm, 30 mm and 40 mm, respectively. The pressure of four types was set to be 15 mTorr, 25 mTorr, 35 mTorr and 50 mTorr for each condition, respectively. Further, bias powers corresponding to the outer diameters a2 were set to be 1400 W, 1550 W, 1585 W, 1650 W, 1800 W and 1950 W, respectively, in order to uniformly maintain an even bias power per unit area in the inner region rather than in the outer peripheral portion of the first ring 91.

B. Experimental Result

In each sample, etching rates of 16 spots in the region within 10 mm from the peripheral portion of the wafer W were inspected and, at the same time, etching rates of 21 spots in the region inner than corresponding region were inspected, thereby investigating the uniformity of the etching rates. The uniformity is defined as an equation of (the maximum value−the minimum value)×100/the mean value.

Figure 24:
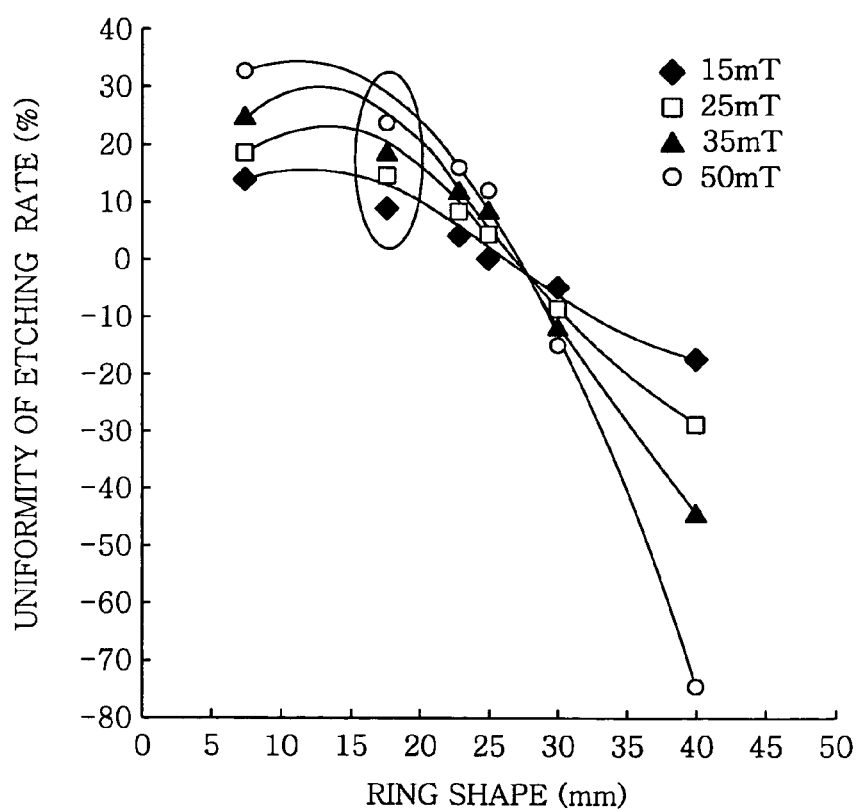
FIG. 24 offers a graph illustrating a relationship between the ring mechanism and in-surface uniformity of etching rate.

The relationship between the outer diameter a2 of the first ring 91 and the uniformity of the etching rate is described in FIG. 24. In FIG. 24, black diamonds, white squares, black triangles and white circles indicate plots corresponding to 15 mTorr, 25 mTorr, 35 mTorr and 50 mTorr, respectively. +values on the axis of the uniformity of etching rate indicate that the etching rates are greater on the peripheral region of the wafer W than on the inner region thereof while the other side on the axis of the uniformity of etching rate indicates that the etching rates are smaller on the peripheral region of the wafer W than on the inner region thereof.

C. Interpretation

If the ring width c of the first ring 91 was 7.5 mm or 17.5 mm, the uniformity was greater than +10% in any one of the pressure while it was observed to be worse than −10% if the ring width c was 40 mm. In contrast, in cases where the ring widths c were 22.5 mm, 25 mm and 30 mm, the uniformity became mostly close to 0% though there was observed a case in which the uniformity was worse than −10% corresponding to the pressure and, further, a difference in uniformity with respect to the pressure was small. Therefore, it is proper that the width c ranges from 15 mm to 35 mm, preferably 22.5 mm to 27.5 mm.

EXPERIMENTAL EXAMPLE 2

Next, by setting a model of a dielectric flux density on an in-surface of the wafer W, the reason why the result provided in FIG. 24 was obtained will be explained based on the model.

Figure 25:
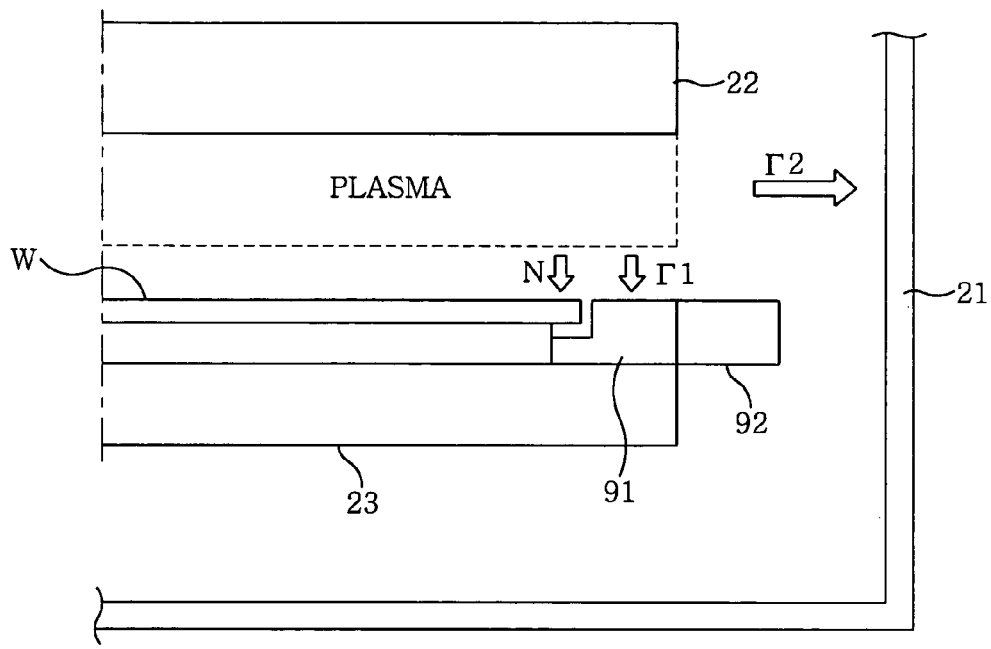
FIG. 25 presents a drawing for describing operation of the ring mechanism in accordance with the fourth preferred embodiment.

Referring to FIG. 25, if the dielectric flux density getting into the region of the wafer W 10 mm inward from the peripheral portion thereof (peripheral portion) is defined as N, an equation (1) is established.

$$2\pi \cdot r0 \cdot h \cdot D \cdot N = \Gamma 1 + \Gamma 2 \quad (1)$$

Herein, r0 represents a radius of the wafer W; D, a thickness of plasma; D, a diffusion coefficient; Γ1, a dielectric flux density flowing toward the first ring; and Γ2, a dielectric flux density flowing toward the sidewall of the processing vessel, respectively. Further, Γ1 and Γ2 are defined by equations (2) and (3), respectively.

$$\Gamma 1 = 2\pi \cdot r0 \cdot h \cdot D \cdot B \cdot np \quad (2)$$

$$\Gamma 2 = 2\pi \cdot r0 \cdot h \cdot D \cdot (\delta n/\delta r)0 \quad (3)$$

Herein, B represents mobility and is expressed as B=B0 (r$^2$-r0$^2$) if B0 is defined as mobility at an initial position (peripheral portion of the wafer). Further, np is a measurement value of an electron density at an outer peripheral portion (a position 100 mm away from the center) of the wafer W in each pressure. n indicates an electron density at a position far away from a central position of the wafer W in a radial direction by a value of r and is expressed by an equation (4).

$$n = n0(1 - kr^2) \quad (4)$$

Herein, n0 is a measurement value of an electron density at the peripheral portion of the wafer W while k represents an integer. If calculated from the equations (1), (2) and (3), N is expressed by an equation (5) as follows.

$$N = B \cdot np + (\delta n/\delta r)0 \quad (5)$$

Herein, np can be calculated based on an approximate expression representing a relationship between a radial (the direction toward the peripheral portion) distance from the central portion of the wafer W and an electron density by measuring electron densities of the radial direction among plasma at a plurality of spots.

Further, the value of (δn/δr)0 can also be obtained from the approximate expression. Thus, the relationship between a radial position and the dielectric flux density N getting into the peripheral region were inspected for each of the pressures 15 mTorr, 35 mTorr and 50 mTorr.

Figure 26:
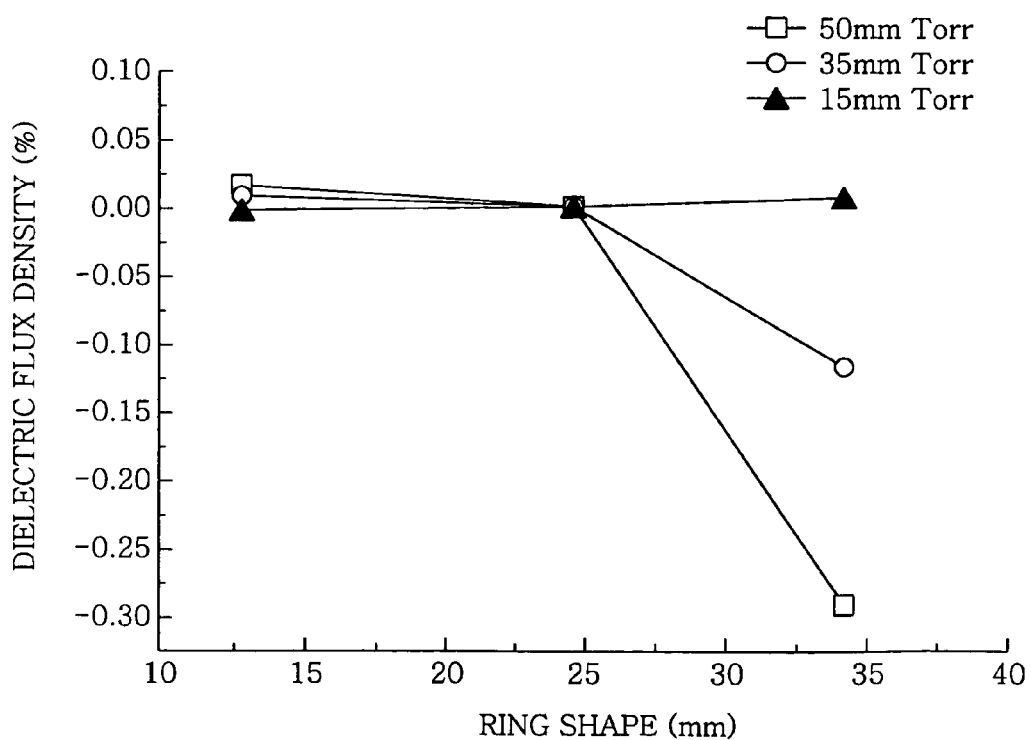
FIG. 26 shows a relationship between width of the focus ring and dielectric flux density of a peripheral region of a wafer.

The result is provided in FIG. 26. In the drawing, black triangles, white circles and white squares represent data corresponding to 15 mTorr, 35 mTorr and 50 mTorr, respectively. In performing calculation, resistivities of plasma corresponding to 15 mTorr, 35 mTorr and 50 mTorr were set as 5 Ωm, 10 Ωm and 30 Ωm, respectively.

Moreover, a dielectric flux density ratio on a vertical axis indicates a ratio of the dielectric flux density with respect to a dielectric flux density n15 in the pressure of 15 mTorr at a position 25 mm away from an inner peripheral portion of the ring which is defined as 0. The ratio is expressed as:

(N−n15)/n15×100[%]

When considering the relation between a level of a pressure-dependency of a dielectric flux density on the peripheral region of the wafer W and the outer diameter a2 of the first ring 91 based on FIG. 26, it was observed that the dielectric flux density is dispersed by the pressure when the ring width a3 is narrow while the dispersion is reduced as the ring width a3 of the first ring 91 is widened. Further, in a relation between the pressure and the dielectric flux density, the dielectric flux density in increased as the pressure is increased. If the ring width c of the first ring 91 gets larger than a predetermined value (25 mm), the dispersion of the dielectric flux density due to the pressure is increased again. Further, the dielectric flux density is reduced as the pressure gets larger and, then, such a relation between each other is reversed again.

Accordingly, the actual experimental result provided in FIG. 24 and the simulation result shown in FIG. 26 are substantially coincident in view of the tendency indicated by them.

Here, it will be considered why such tendency exists.

When the ring width c of the first ring 91 is small, the influence of Γ1 exerted on the dielectric flux density N getting into the peripheral region of the wafer is small but the influence of Γ2 is great. As a result, the dielectric flux density N is fluctuated by the pressure. As the outer diameter a2 of the first ring 91 gets enlarged, the influence of Γ2 is reduced and a degree of fluctuation of the N value due to the pressure is reduced. Further, the N value in each pressure is converged.

If the ring width c of the first ring 91 gets much larger than a predetermined value, however, the influence of Γ1 is increased and a degree of fluctuation of the N values due to the pressure is also increased. Further, the influence of Γ2 on a cause of the variation of the N values is considered to be smaller that that of Γ1.

Accordingly, if the ring width c of the first ring 91 is determined within a range from 15 mm to 35 mm, the influences of Γ1 and Γ2 on the N value are controlled to be small, so that the effect described above is likely to be obtained.

EXPERIMENTAL EXAMPLE 3

The ring width c of the first ring 91 was set to be 17.5 mm to 30 mm and etching was conducted on an 8-inch wafer having a silicon nitride film formed on the surface thereof by employing the plasma processing device shown in FIG. 22, so that the in-surface uniformity of the etching rate was inspected. A gaseous mixture of $C_5F_8$ gas, Ar gas and $O^2$ gas was used as a processing gas; the pressure was set to be 30 mTorr (3990 kPa); a high frequency power applied to the upper electrode was set to be 1530 W; and a high frequency power applied to the lower electrode was set to be 1350 W in case the ring width c was 17.5 mm and 1600 W in case the ring width c was 30 mm.

The in-surface uniformity of the etching rate was explained to be 16.0% in case the ring width c was 17.5 mm and 10.8% in case the ring width c was 30 mm. Accordingly, it was proved that the in-surface uniformity of the etching rate of polysilicon can be improved by adjusting the outer diameter a2.

Though the present invention has been described by exemplifying an etching processing as a plasma processing in the above, the present invention can also be applied to, for example, an ashing processing for carbonizing a resist. Further, the method for generating plasma is not limited to that described in the preferred embodiments of the present invention. That is, it is also possible to generate plasma by way of applying a high frequency power through the use of a coil-type antenna.

In accordance with the fourth embodiment, a uniform plasma processing can be realized and, further, a stable plasma processing can be carried out even in case the process pressure is changed.

INDUSTRIAL APPLICABILITY

The present invention is a ring mechanism including a focus ring disposed to surround a wafer W mounted on a susceptor (lower electrode) loaded in a processing chamber; and a divided cover ring, which serve to diffuse plasma to the radial outside of the focus ring, wherein the ring mechanism is capable of eliminating a potential difference between the wafer W and the focus ring and preventing an arc discharge generated between the wafer W and the focus ring due to the plasma by providing an annular gap δ1 formed between the divided ring and allowing the plasma to get into the gap.

Further, by installing an inner ring (focus ring) for surrounding the wafer W mounted on the lower electrode and an outer ring formed of quartz for surrounding the inner ring in a manner that the top surface of the inner ring is higher than the top surface of the outer ring or the top surface of the outer ring is lower than the top surface of the inner ring, a phenomenon caused by the oxygen radicals can be prevented, thereby realizing a uniform plasma processing.

Furthermore, in the conductive first ring disposed to surround the wafer on the susceptor, the ring width is set to range from 22.5 mm to 30 mm based on the fact that the plasma density of the peripheral portion of the wafer and the influence of the process pressure on the uniformity of such plasma density is dependent on a distance from the peripheral portion of the wafer to the outer peripheral portion of the ring.

While the invention has been shown and described with respect to the preferred embodiments, it will be understood by those skilled in the art that various changes and modifications may be made without departing from the spirit and scope of the invention as defined in the following claims.

What is claimed is:

1. A ring mechanism comprising:
a focus ring surrounding an object to be processed mounted on a susceptor disposed in a processing chamber capable of maintaining a vacuum therein; and
a cover ring fitted around an outer periphery of the focus ring, wherein the cover ring includes a first and a second cover ring part and a first clearance or an electrical conductor is disposed between the first and the second cover ring part,
wherein the first cover ring part surrounds an outer periphery of the focus ring, and the second cover ring part surrounds an outer periphery of the first cover ring part,
wherein the second cover ring part has a tapered surface, a height of the tapered surface descending toward an outer peripheral side of the second cover ring, and
wherein the second cover ring part is an electrically insulating ring.

2. The ring mechanism of claim 1, wherein the first clearance is disposed between the first and the second cover ring part, and is formed in an annular shape around an entire circumference therebetween, the first clearance having a width at least allowing a plasma to get thereinto.

3. The ring mechanism of claim 1, wherein the first clearance having a width allowing a plasma to get thereinto is disposed between the first and the second cover ring part,
the first cover ring part is disposed adjacent to the focus ring and having a rectangular cross section; and
the second cover ring part is disposed at an outer peripheral side of the first cover ring part, and
wherein each of the first cover ring and the second cover ring part is supported on a support member fixed to the susceptor with a second clearance therebetween, which is narrower than the first clearance.

4. The ring mechanism of claim 1, wherein the conductor is disposed between the first and the second cover ring part and the conductor is one of Si, SiC and Al.

5. The ring mechanism of claim 1, wherein the conductor is disposed between the first and the second cover ring part, and, at a time of generating a plasma by applying a high frequency power, the plasma diffuses outwardly along diametric directions of the object to be processed by the conductor.

6. The ring mechanism of claim 5, wherein a current passageway is formed by the conductor to allow a current generated by the high frequency power to be transferred between the focus ring and the cover ring to thereby reduce a potential difference between the focus ring and the object to be processed.

7. The ring mechanism of claim 1, wherein the first clearance or the electrical conductor is isolated from the focus ring.

8. The ring mechanism of claim 1, wherein the first clearance or the electrical conductor is formed in a direction normal to a mounting surface of the susceptor.

9. The ring mechanism of claim 1, wherein an inner diameter of the first cover ring part is larger than an outer diameter of the focus ring, and an inner diameter of the second cover ring part is larger than an outer diameter of the first cover ring part.

10. A plasma processing device comprising:
a processing chamber capable of maintaining a vacuum therein;
a gas exhaust system for creating a vacuum state by exhausting a gas in the processing chamber;
a lower electrode mounted in the processing chamber for mounting and maintaining an object to be processed;
an upper electrode mounted in the processing chamber for introducing a processing gas;
a high frequency power supply for applying a high frequency power to at least one of the lower electrode and the upper electrode;
a focus ring for surrounding the object to be processed mounted on the lower electrode; and
a cover ring fitted around an outer periphery of the focus ring,
wherein the cover ring includes a first and a second cover ring part and a first clearance or an electrical conductor is disposed between the first and the second cover ring part,
wherein the first cover ring part surrounds an outer periphery of the focus ring, and the second cover ring part surrounds an outer periphery of the first cover ring part,
wherein the second cover ring part has a tapered surface, a height of the tapered surface descending toward an outer peripheral side of the second cover ring, and wherein the second cover ring part is an electrically insulating ring.

11. The plasma processing device of claim 10, wherein the conductor is disposed between the first and the second cover ring part and the conductor is one of Si, SiC and Al.

12. The plasma processing device of claim 10, wherein the first clearance is disposed between the first and the second cover ring part, and, at a time of generating a plasma by applying a high frequency power, the plasma gets into the clearance beyond the outer periphery of the focus ring and diffuses outwardly along diametric directions of the object to be processed.

13. The plasma processing device of claim 12, wherein the plasma getting into the first clearance serves as an electrically conductive medium forming a current passageway in the clearance to allow a current generated by the high frequency power to be transferred between the focus ring and the cover ring thereby reducing a potential difference between the focus ring and the object to be processed.

14. The plasma processing device of claim 10, wherein the conductor is disposed between the first and the second cover ring part, and, at a time of generating a plasma by applying a high frequency power, the plasma diffuses outwardly along diametric directions of the object to be processed by the conductor.

15. The plasma processing device of claim 14, wherein a current passageway is formed by the conductor to allow a current generated by the high frequency power to be transferred between the focus ring and the cover ring thereby reducing a potential difference between the focus ring and the object to be processed.

16. The plasma processing device of claim 10, wherein the first clearance is disposed between the first and the second cover ring part, and is formed in an annular shape around an entire circumference therebetween, the first clearance having a width at least allowing the plasma to get thereinto.

17. The plasma processing device of claim 10, wherein the first clearance having a width allowing the plasma to get thereinto is disposed between the first and the second cover ring part, the first cover ring part is disposed adjacent to the focus ring and having a rectangular cross section and the second cover ring part having a shape of a tapered surface toward an outer peripheral side thereof is disposed at an outer peripheral side of the first cover ring, and
wherein each of the first cover ring and the second cover ring part is supported on a support member fixed to the susceptor with a second clearance therebetween, which is narrower than the first clearance.

18. The plasma processing device of claim 10, wherein the first clearance or the electrical conductor is isolated from the focus ring.

19. The plasma processing device of claim 10, wherein the first clearance or the electrical conductor is formed in a direction normal to a mounting surface of the susceptor.

20. The plasma processing device of claim 10 wherein an inner diameter of the first cover ring part is larger than an outer diameter of the focus ring, and an inner diameter of the second cover ring part is larger than an outer diameter of the first cover ring part.

21. A ring mechanism comprising:
an electrically conductive first ring for surrounding an object to be processed mounted on a susceptor disposed in a processing chamber capable of maintaining a vacuum therein; and
an electrically insulating second ring disposed to surround the conductive first ring,
wherein the conductive first ring includes a planar surface portion disposed outwardly from an inner periphery thereof to be substantially even with a to-be-processed surface of the object to be processed and a protruded portion disposed outside the planar surface portion to be higher than the second ring and the to-be-processed surface of the object to be processed,
wherein the first ring includes an inclined surface connecting the planar surface portion of an inner peripheral side to the protruded portion disposed outside, and
wherein the protruded portion includes a horizontal upper plane.

22. The ring mechanism of claim 21, wherein a width of the planar surface portion is equal to or greater than 10 mm.

23. The ring mechanism of claim 21, wherein a clearance between an outer peripheral portion of the object to be processed and an inner peripheral portion of the conductive first ring is not more than 2 mm.

24. A plasma processing device comprising:
a processing chamber capable of maintaining a vacuum therein;
a gas exhaust system for creating a vacuum state by exhausting a gas in the processing chamber;
a lower electrode mounted in the processing chamber for mounting and maintaining an object to be processed;
an upper electrode mounted in the processing chamber for introducing a processing gas;
a high frequency power supply for applying high frequency powers of different frequencies to the lower electrode and the upper electrode;
an electrically conductive first ring for surrounding the object to be processed mounted on the lower electrode; and
an electrically insulating second ring disposed to surround the conductive first ring,
wherein the first ring includes a planar surface portion disposed outwardly from an inner peripheral portion thereof to be substantially even with a to-be-processed surface of the object to be processed and a protruded portion disposed outside the planar surface portion to be higher than the second ring and the to-be-processed surface of the object to be processed,
wherein the conductive first ring includes an inclined surface connecting the planar surface portion of an inner peripheral side to the protruded portion disposed outside, and
wherein the protruded portion has a horizontal upper plane.

25. The plasma processing device of claim 24, wherein a width of the planar surface portion is equal to or greater than 10 mm.

26. The plasma processing device of claim 24, wherein a clearance between an outer peripheral portion of the object to be processed and an inner peripheral portion of the conductive first ring is not more than 2 mm.

27. A plasma processing apparatus comprising:
a processing chamber capable of maintaining a vacuum therein;
a gas exhaust system for creating a vacuum state by exhausting a gas in the processing chamber;
a lower electrode mounted in the processing chamber for mounting and maintaining an object to be processed;
an upper electrode mounted in the processing chamber for introducing a processing gas;
a high frequency power supply for applying high frequency powers of different frequencies to the lower electrode and the upper electrode;

an electrically conductive first ring for surrounding the object to be processed mounted on the lower electrode with a clearance therebetween; and an electrically insulating second ring disposed to surround the conductive first ring, wherein the insulating second ring has a declining portion descending outwards from an inner peripheral portion of the insulating second ring and the conductive first ring has a width ranging from 15 mm to 35 mm, and wherein a top surface of the conductive first ring is set to be even with a surface to be processed of the object to be processed.

28. A ring mechanism comprising:

an electrically conductive first ring for surrounding an object to be processed mounted on a susceptor disposed in a processing chamber capable of maintaining a vacuum therein; and an electrically insulating second ring disposed to surround the conductive first ring, wherein the conductive first ring includes a planar surface portion and an inclined portion rising outward from an inner peripheral portion of the conductive first ring and the insulating second ring includes a declining portion descending outwards from an inner peripheral portion of the insulating second ring, and wherein the planar surface portion is set to be even with a surface to be processed of the object to be processed.

29. The ring mechanism of claim 1, wherein the first clearance is disposed between the first and the second cover ring part, and, at a time of generating a plasma by applying a high frequency power, the plasma gets into the first clearance beyond the outer periphery of the focus ring and diffuses outwardly along diametric directions of the object to be processed.

30. The ring mechanism of claim 29, wherein the plasma getting into the first clearance serves as an electrically conductive medium forming a current passageway in the first clearance to allow a current generated by the high frequency power to be transferred between the focus ring and the cover ring to thereby reduce a potential difference between the focus ring and the object to be processed.

31. A plasma processing device comprising:

a processing chamber capable of maintaining a vacuum therein;

a gas exhaust system for creating a vacuum state by exhausting a gas in the processing chamber;

a lower electrode mounted in the processing chamber for mounting and maintaining an object to be processed;

an upper electrode mounted in the processing chamber for introducing a processing gas;

a high frequency power supply for applying high frequency powers of different frequencies to the lower electrode and the upper electrode;

an electrically conductive first ring for surrounding the object to be processed mounted on the lower electrode; and an electrically insulating second ring disposed to surround the conductive first ring, wherein the conductive first ring includes a planar surface portion and an inclined portion rising outward from an inner peripheral portion of the conductive first ring and the insulating second ring includes a declining portion descending outwards from an inner peripheral portion of the insulating second ring, and wherein the planar surface portion is set to be even with a surface to be processed of the object to be processed.

32. A ring mechanism comprising:

an electrically conductive first ring for surrounding an object to be processed mounted on a lower electrode with a clearance therebetween; and an electrically insulating second ring disposed to surround the electrically conductive first ring, wherein the insulating second ring has a declining portion descending outwards from an inner peripheral portion of the insulating second ring and the conductive first ring has a width ranging from 15 mm to 35 mm, and wherein a top surface of the conductive first ring is set to be even with a surface to be processed of the object to be processed.

* * * * *